(12) United States Patent
Jung et al.

(10) Patent No.: US 12,113,084 B2
(45) Date of Patent: Oct. 8, 2024

(54) IMAGE SENSOR

(71) Applicant: SAMSUNG ELECTRONICS CO., LTD., Suwon-si (KR)

(72) Inventors: Taesub Jung, Hwaseong-si (KR); Kyungho Lee, Suwon-si (KR); Masato Fujita, Hwaseong-si (KR); Doosik Seol, Seoul (KR); Kyungduck Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 330 days.

(21) Appl. No.: 17/477,232

(22) Filed: Sep. 16, 2021

(65) Prior Publication Data
US 2022/0109015 A1   Apr. 7, 2022

(30) Foreign Application Priority Data

Oct. 5, 2020   (KR) .......................... 10-2020-0128276

(51) Int. Cl.
*H01L 27/146*   (2006.01)
*H01L 27/148*   (2006.01)

(52) U.S. Cl.
CPC .... *H01L 27/1463* (2013.01); *H01L 27/14612* (2013.01); *H01L 27/14621* (2013.01); *H01L 27/14627* (2013.01); *H01L 27/14636* (2013.01); *H01L 27/14831* (2013.01)

(58) Field of Classification Search
CPC .......... H01L 27/1463; H01L 27/14612; H01L 27/14621; H01L 27/14627; H01L 27/14636; H01L 27/14831; H01L 27/14603; H01L 27/14641; H01L 27/14643; H01L 27/1461; H04N 25/702
See application file for complete search history.

(56) References Cited

U.S. PATENT DOCUMENTS

| | | | |
|---|---|---|---|
| 10,014,338 B2 | 7/2018 | Lee | |
| 10,461,109 B2 | 10/2019 | Wu et al. | |
| 10,608,026 B2 | 3/2020 | Go et al. | |
| 2019/0043901 A1 | 2/2019 | Honda et al. | |
| 2019/0378864 A1 | 12/2019 | Innocent | |
| 2020/0235149 A1 | 7/2020 | Shiraishi et al. | |
| 2020/0251521 A1* | 8/2020 | Lee | ................... H01L 27/14645 |

FOREIGN PATENT DOCUMENTS

| | | |
|---|---|---|
| JP | 2018-201015 | 12/2018 |
| KR | 10-2019-0110538 | 9/2019 |

* cited by examiner

*Primary Examiner* — Kyoung Lee
(74) *Attorney, Agent, or Firm* — F. Chau & Associates, LLC

(57) ABSTRACT

An image sensor is provided. The image sensor includes a first pixel region and a second pixel region located within a semiconductor substrate, a first isolation layer surrounding the first pixel region and the second pixel region, a second isolation layer located between the first pixel region and the second pixel region, and a microlens arranged on the first pixel region and the second pixel region. Each of the first pixel region and the second pixel region include a photoelectric conversion device. The second isolation layer includes at least one first open region that exposes a portion of an area located between the first pixel region and the second pixel region.

20 Claims, 19 Drawing Sheets

IMAGE SENSOR

CROSS-REFERENCE TO RELATED APPLICATION

This U.S. non-provisional patent application claims the benefit of priority under 35 U.S.C. § 119 to Korean Patent Application No. 10-2020-0128276, filed on Oct. 5, 2020, in the Korean Intellectual Property Office, the disclosure of which is incorporated by reference in its entirety herein.

1. TECHNICAL FIELD

The inventive concept relates to image sensors, and more particularly, to an image sensor including an isolation layer.

2. DISCUSSION OF RELATED ART

An image sensor captures an image and converts the captured image into an electrical signal. Image sensor may be used not only in general consumer electronic devices such as digital cameras, mobile phone cameras, or portable camcorders, but also in cameras that are mounted on vehicles, security systems, or robots.

An auto focusing (AF) method may be used for automatically detecting the focus of an image sensor. A phase difference auto focusing (PAF) technique may be used to detect the focus quickly. In PAF, light transmitted by a lens is split and detected from different focus-detection pixels, and a focal length is adjusted by automatically driving a focusing lens such that detection signals corresponding to a result of the detection have different intensities at the same phase.

SUMMARY

At least one embodiment of the inventive concept provides an image sensor with an isolation layer including an open region.

According to an exemplary embodiment of the inventive concept, there is provided an image sensor including a first pixel region and a second pixel region located within a semiconductor substrate, a first isolation layer surrounding the first pixel region and the second pixel region, a second isolation layer located between the first pixel region and the second pixel region, and a microlens arranged on the first pixel region and the second pixel region. Each of the first pixel region and the second pixel region include a photoelectric conversion device. The second isolation layer includes at least one first open region that exposes a portion of an area located between the first pixel region and the second pixel region.

According to an exemplary embodiment of the inventive concept, there is provided an image sensor including a semiconductor substrate having a first surface and a second surface opposite to the first surface, a first pixel region and a second pixel region located within the semiconductor substrate, a first isolation layer surrounding the first pixel region and the second pixel region, and a second isolation layer located between the first pixel region and the second pixel region. Each of the first pixel region and the second pixel region include a photoelectric conversion device. The first isolation layer and the second isolation layer extend from the first surface to the second surface of the semiconductor substrate, and the second isolation layer includes a first open region that exposes a portion of an area between the first pixel region and the second pixel region.

According to an exemplary embodiment of the inventive concept, there is provided an image sensor including a first pixel region and a second pixel region located within a semiconductor substrate, a first isolation layer surrounding the first pixel region and the second pixel region, a second isolation layer located between the first pixel region and the second pixel region, and a floating diffusion region located in the first pixel region. The floating diffusion region is for accumulating photocharges generated by the photoelectric conversion device in each of the first pixel region and the second pixel region. Each of the first pixel region and the second pixel region includes a photoelectric conversion device. The second isolation layer includes an open region that exposes a portion of an area located between the first pixel region and the second pixel region.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EXEMPLARY EMBODIMENTS

Embodiments of the inventive concept will now be described more fully with reference to the accompanying drawings.

Figure 1:
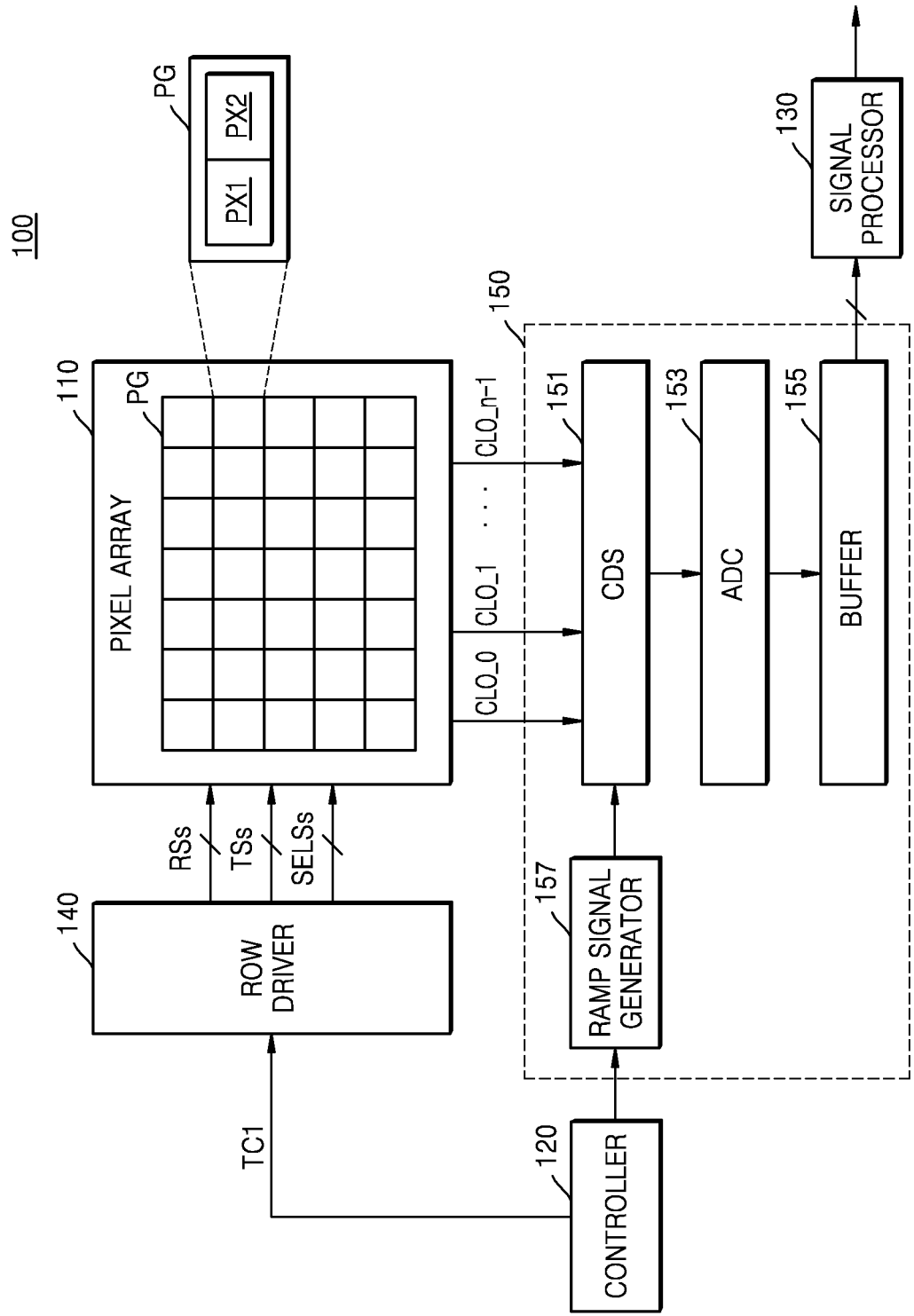
FIG. 1 is a block diagram of a structure of an image sensor according to an exemplary embodiment of the inventive concept.

FIG. 1 is a block diagram of a structure of an image sensor 100 according to an exemplary embodiment of the inventive concept.

Referring to FIG. 1, the image sensor 100 includes a pixel array 110, a controller 120 (e.g., a control circuit), a signal processor 130, a row driver 140 (e.g., a driver circuit), and a signal reader 150 (e.g., a reader circuit). In an embodiment, the signal reader 150 include a correlated double sampler (CDS) 151, an analog-to-digital converter (ADC) 153, and a buffer 155.

The pixel array 110 may include a plurality of pixels. The plurality of pixels may generate image signals corresponding to an object. The pixel array 110 may output pixel signals to the CDS 151 via corresponding first through n-th column output lines CLO_0 through CLO_n-1.

The pixel array 110 may include a plurality of pixel groups. In an exemplary embodiment, each of the plurality of pixel groups PG is defined by a first isolation layer. An exemplary circuit corresponding to each pixel group PG will be described later with reference to FIG. 2.

Each of the pixel groups PG may include a plurality of pixels, for example, a first pixel PX1 and a second pixel PX2. In an exemplary embodiment, the first pixel PX1 and the second pixel PX2 are separated from each other by a second isolation layer, and may be defined by the first isolation layer and the second isolation layer.

According to an embodiment, each of the pixel groups PG includes two pixels. Alternatively, according to an embodiment, each of the pixel groups PG may include four pixels. However, the number of pixels included in one pixel group PG may vary.

The first pixel PX1 and the second pixel PX2 may include corresponding photoelectric conversion devices and may absorb light and generate photocharges. For example, the photoelectric conversion device may be a photodiode. According to an embodiment, the first pixel PX1 and the second pixel PX2 included in the same pixel group PG share a floating diffusion region in which the photocharges generated by the photoelectric conversion devices are accumulated. However, embodiments of the inventive concept are not limited thereto, and the first pixel PX1 and the second pixel PX2 may include independent floating diffusion regions, respectively.

The second isolation layer may be formed between a first photoelectric conversion region where the photoelectric conversion device of the first pixel PX1 is formed and a second photoelectric conversion region where the photoelectric conversion device of the second pixel PX2 is formed. In an exemplary embodiment, the second isolation layer includes an open region that exposes a portion of an area between the first photoelectric conversion region and the second photoelectric conversion region. Because the second isolation layer includes the open region formed therein, the image sensor 100 may prevent light-sensing sensitivity from being reduced due to the second isolation layer. In addition, a passivation layer formed in the open region of the second isolation layer and doped with P-type impurities may improve linearity of full wells of the first pixel PX1 and the second pixel PX2.

According to an exemplary embodiment, the first pixel PX1 and the second pixel PX2 included in the same pixel group PG are aligned with each other in a first direction (for example, a row direction). Based on a first pixel signal output by the first pixel PX1 and a second pixel signal output by the second pixel PX2, an AF function in a second direction (for example, a column direction) may be performed.

Alternatively, according to an embodiment, the first pixel PX1 and the second pixel PX2 included in the same pixel group PG are aligned with each other in the second direction. Based on a first pixel signal output by the first pixel PX1 and a second pixel signal output by the second pixel PX2, an AF function in the first direction may be performed. However, the image sensor 100 is not limited thereto. Alternatively, according to an embodiment, the first pixel PX1 and the second pixel PX2 included in the same pixel group PG are aligned with each other in a direction (diagonal direction) between the first direction and the second direction.

According to an embodiment, the first pixel PX1 and the second pixel PX2 included in each of the pixel groups PG are phase detection pixels, respectively, and generate phase signals that are used to calculate a phase difference between images. The pixel groups PG may be used to focus an object. The phase signals may include information about the locations of images formed on the image sensor 100, and may be used to calculate phase differences between the images. Based on the calculated phase differences, an in-focus position of a lens of an electronic device including the image sensor 100 may be calculated. For example, a position of the lens that results in a phase difference of 0 may be the in-focus position.

The pixel groups PG may be used not only to focus the object but also to measure a distance between the object and the image sensor 100. To measure the distance between the object and the image sensor 100, additional pieces of information, such as phase differences between the images formed on the image sensor 100, the distance between the lens and the image sensor 100, the size of the lens, and the in-focus position of the lens, may be referred to.

The controller 120 may control the row driver 140 so that the pixel array 110 absorbs light and accumulates photocharges or temporarily stores the accumulated photocharges, and outputs pixel signals according to the stored photocharges outside of the pixel array 110. The controller 120 may control the signal reader 150 to measure the levels of the pixel signals provided by the pixel array 110.

The row driver 140 may generate signals RSs, TSs, and SELSs for controlling the pixel array 110, and may provide the generated signals to the pixel groups PG. According to an embodiment, the row driver 140 determines activation and deactivation timing of reset control signals RSs, transmission control signals TSs, selection signals SELSs provided by the pixel groups PG, based on whether to perform an AF function or a distance measuring function.

The CDS 151 may sample and hold a pixel signal provided by the pixel array 110. The CDS 151 may perform a double sampling on a level of certain noise and levels of the pixel signal to output a level corresponding to a difference between the level of the certain noise and the level of the pixel signal. In addition, the CDS 151 may receive a ramp signal generated by a ramp signal generator 157, compare the ramp signal with the level corresponding to the difference between the level of the certain noise and the level of the pixel signal, and output a result of the comparison to the ADC 153. The ADC 153 may convert an analog signal corresponding to a level received from the CDS 151 into a digital signal. The buffer 155 may latch the digital signal, and the latched digital signal may be sequentially output to the signal processor 130 or outside of the image sensor 100.

The signal processor 130 may perform signal processing, based on the pixel signals output by the pixel groups PG. For example, the signal processor 130 may perform noise reduction, gain adjustment, waveform shaping, interpolation, white balance adjustment, gamma correction, and edge emphasis. The signal processor 130 may also perform a phase difference calculation for an AF operation by outputting signal-processed information to the processor of the electronic device including an image sensor during an AF operation. According to an exemplary embodiment, the signal processor 130 is included in a processor located outside the image sensor 100.

Figure 2:
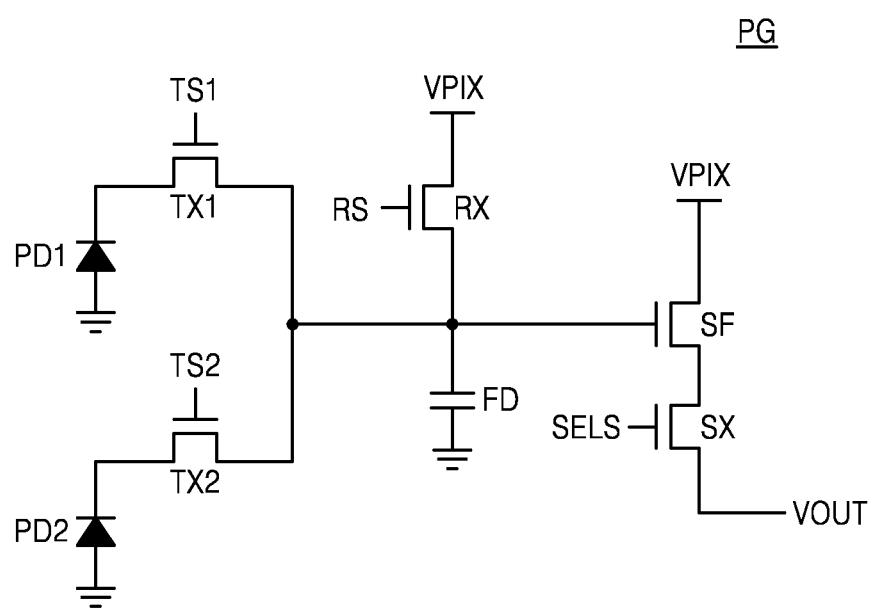
FIG. 2 is a circuit diagram of a pixel group included in a pixel array of FIG. 1.

FIG. 2 is a circuit diagram of a pixel group PG included in the pixel array 110 of FIG. 1. Although two pixels are included in a single pixel group PG in FIG. 2, more than two pixels may be included in the single pixel group PG.

Referring to FIG. 2, one pixel group PG includes a first photoelectric conversion device PD1, a second photoelectric conversion device PD2, a first transfer transistor TX1, a second transfer transistor TX2, a reset transistor RX, an amplification transistor SF, and a selection transistor SX. In contrast with FIG. 2, at least one of the reset transistor RX, the amplification transistor SF, and the selection transistor SX may be omitted.

The first photoelectric conversion device PD1 and the second photoelectric conversion device PD2 may generate photocharges that vary according to the intensity of light. For example, the first photoelectric conversion device PD1 and the second photoelectric conversion device PD2, which are P-N junction diodes, may generate charges, namely, electrons as negative charges and holes as positive charges, in proportion to the amount of incident light. Each of the first photoelectric conversion device PD1 and the second photoelectric conversion device PD2 may be at least one of, for example, a photo transistor, a photo gate, a pinned photo diode (PPD), and a combination thereof.

The first transfer transistor TX1 may transmit a photocharge generated by the first photoelectric conversion device PD1 to a floating diffusion region FD according to a first transmission control signal TS1, and the second transfer transistor TX2 may transmit a photocharge generated by the second photoelectric conversion device PD2 to the floating diffusion region FD according to a second transmission control signal TS2. The first transmission control signal TS1 may be applied to a gate terminal of the first transfer transistor TX1 and the second transmission control signal TS2 may be applied to a gate terminal of the second transfer transistor TX2. When the first transfer transistor TX1 and the second transfer transistor TX2 are turned on, the photocharges respectively generated by the first photoelectric conversion device PD1 and the second photoelectric conversion device PD2 may be transmitted to the single floating diffusion region FD and may be accumulated and stored in the single floating diffusion region FD. The first photoelectric conversion device PD1 may be connected between a ground voltage and the first transfer transistor TX1. The second photoelectric conversion device PD2 may be connected between a ground voltage and the second transfer transistor TX2.

The reset transistor RX may periodically reset charges accumulated in the floating diffusion region FD. In an embodiment, a drain electrode of the reset transistor RX is connected to the floating diffusion region FD, and a source electrode thereof is connected to a power voltage VPIX. When the reset transistor RX is turned on according to a reset control signal RS, the power voltage VPIX connected to the source electrode of the reset transistor RX is delivered to the floating diffusion region FD. The reset control signal RS may be applied to a gate terminal of the reset transistor RX. When the reset transistor RX is turned on, the charged accumulated in the floating diffusion region FD may be discharged, and thus, the floating diffusion region FD may be reset.

The amplification transistor SF may be controlled according to the number of photocharges accumulated in the floating diffusion region FD. The amplification transistor SF, which is a buffer amplifier, may buffer a signal according to a charge stored in the floating diffusion region FD. In an embodiment, the amplification transistor SF amplifies a potential change in the floating diffusion region FD and outputs an amplified potential change as a pixel signal VOUT to a column output line (e.g., one of the first through n-th column output lines CLO_0 through CLO_n-1).

The selection transistor SX includes a drain terminal connected to a source terminal of the amplification transistor SF, and may output the pixel signal VOUT to the CDS 151 through the column output line in response to a selection signal SELS. The selection signal SELS is provided to a gate terminal of the selection transistor SX.

In an embodiment, the first pixel PX1 includes the first photoelectric conversion device PD1 and the first transfer transistor TX1, and the second pixel PX2 includes the second photoelectric conversion device PD2 and the second transfer transistor TX2. According to an embodiment, the first pixel PX1 and the second pixel PX2 included in the single pixel group PG share the floating diffusion region FD, and may share at least one of the reset transistor RX, the amplification transistor SF, and the selection transistor SX. However, embodiments of the inventive concept are not limited thereto. In an image sensor 100 according to an exemplary embodiment of the inventive concept, the first pixel PX1 and the second pixel PX2 included in the single pixel group PX include separate floating diffusion regions FD, separate reset transistors RX, separate amplification transistors SF, and separate selection transistors SX, respectively.

Figure 3A:
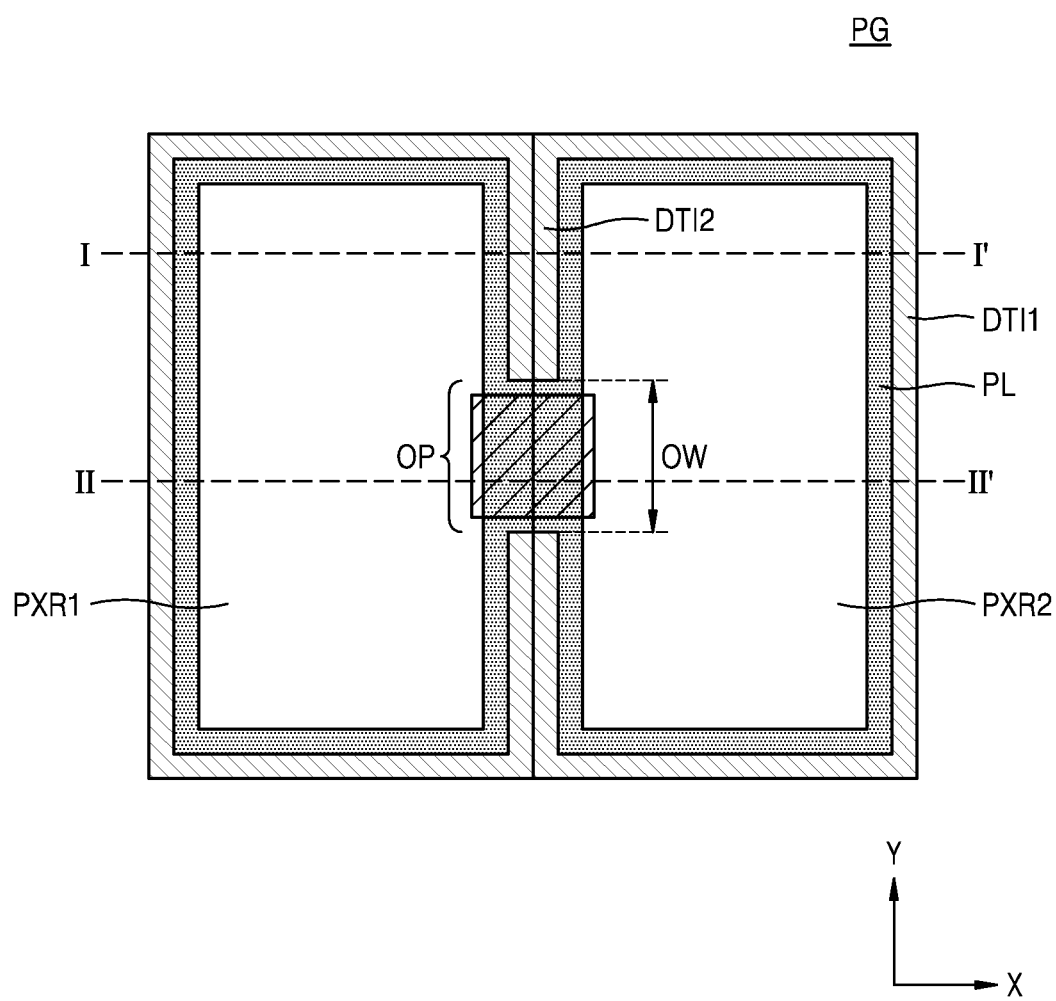
FIGS. 3A and 3B are views of pixel groups included in an image sensor according to an exemplary embodiment of the inventive concept.
Figure 3B:
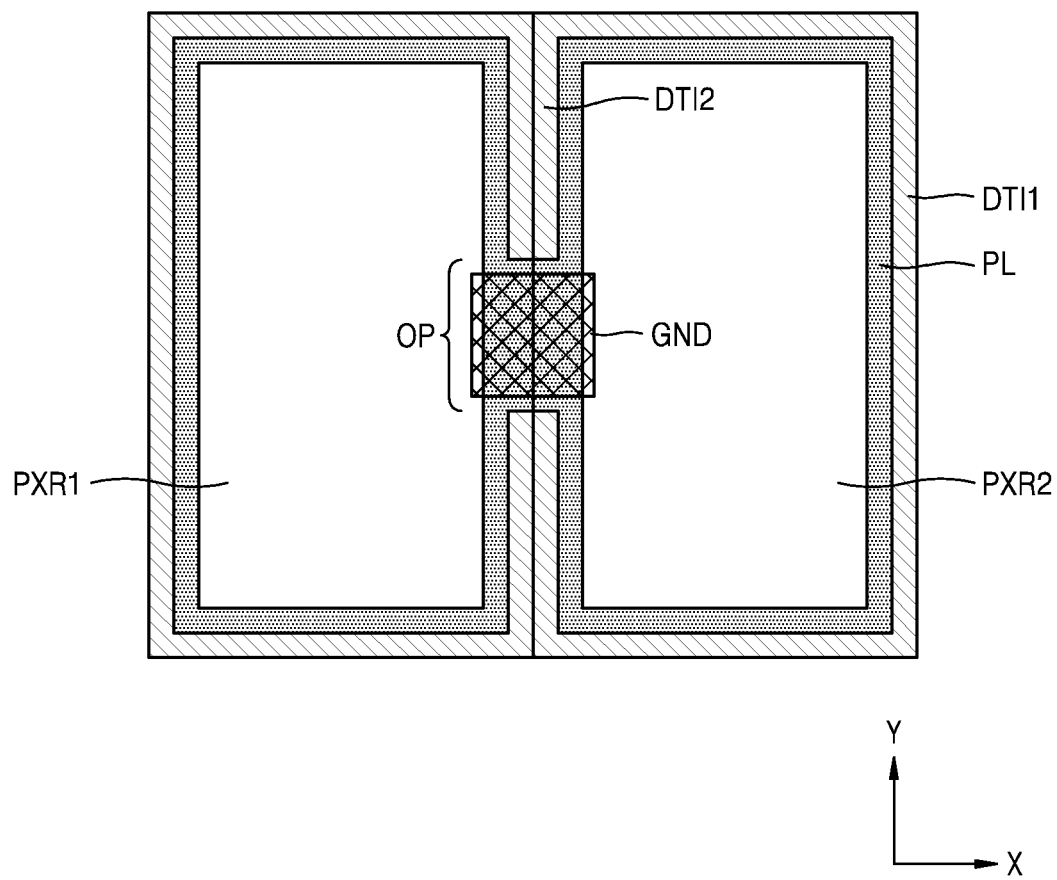
Figure 4:
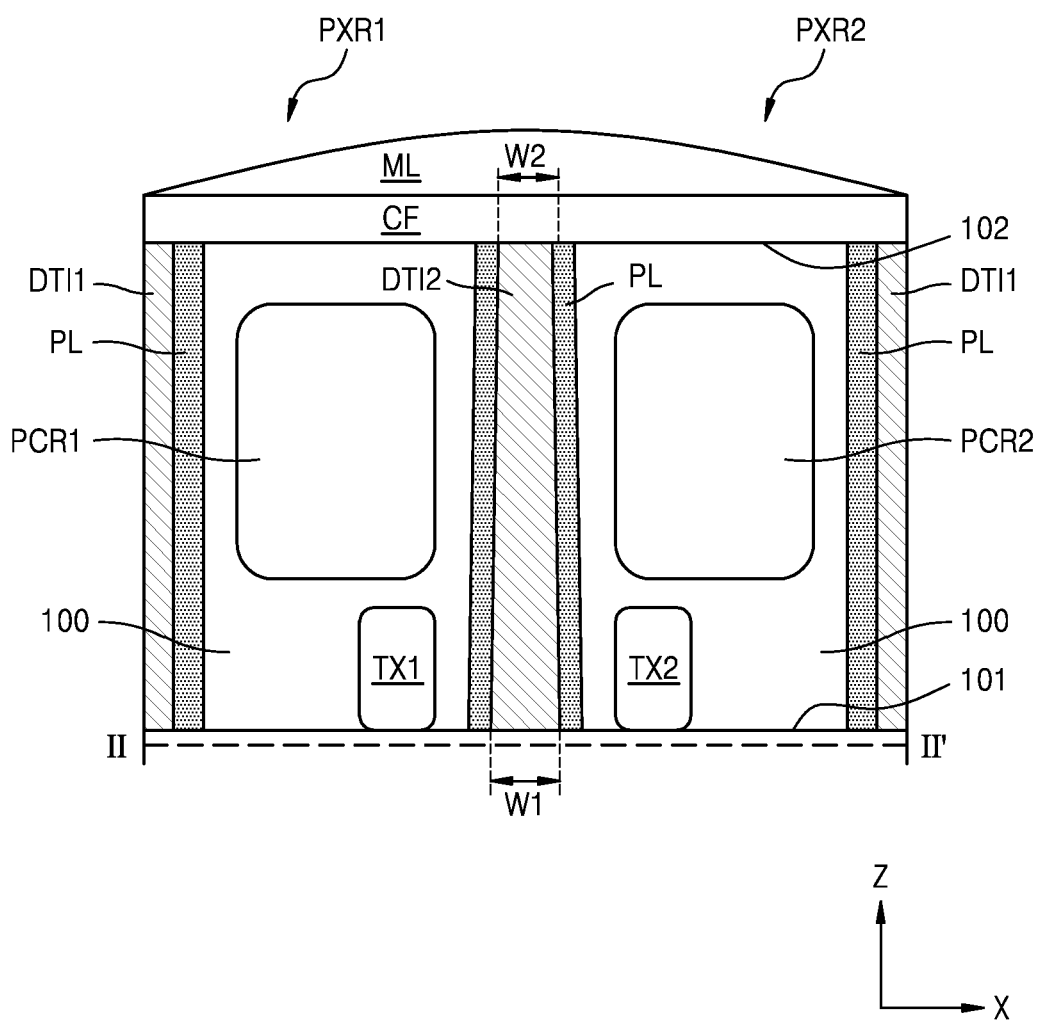
FIG. 4 is a cross-sectional view taken along line I-I' of FIG. 3A.
Figure 5:
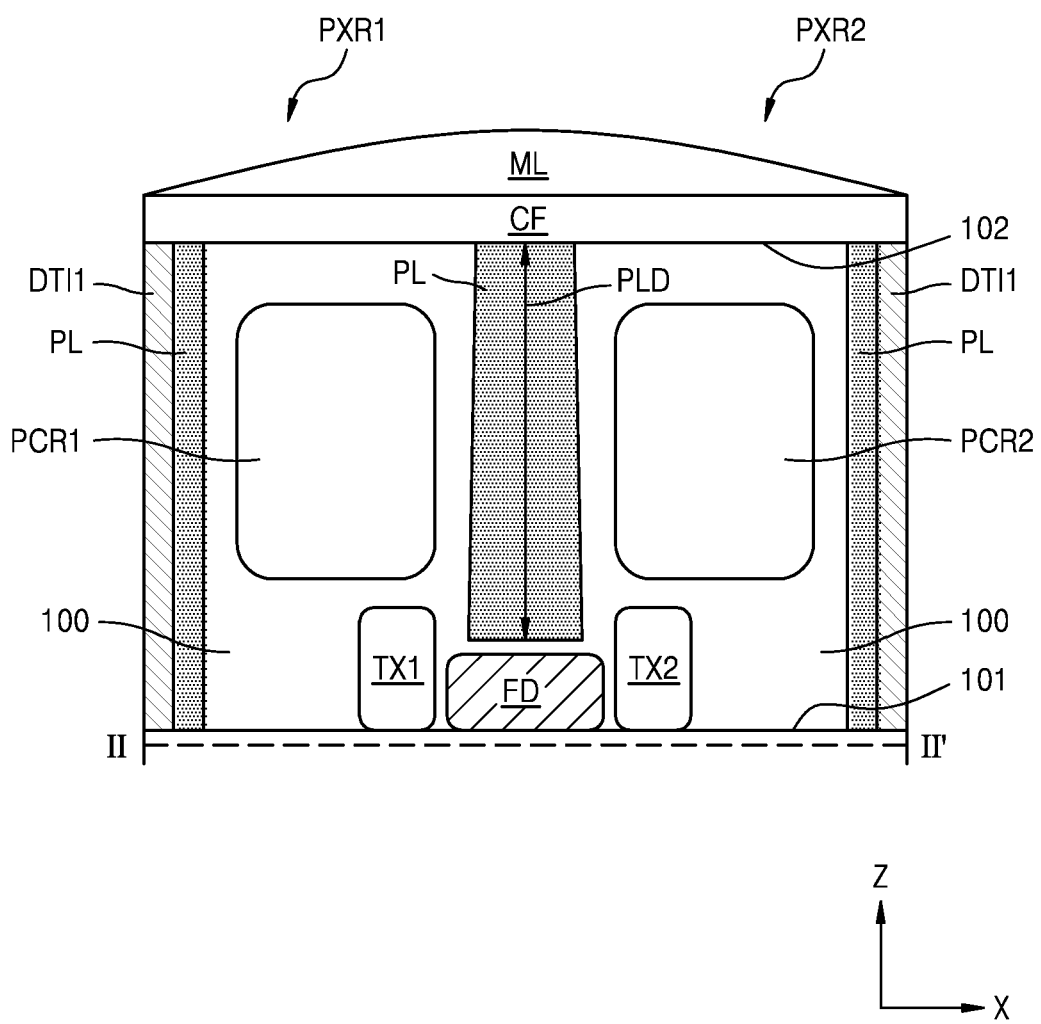
FIG. 5 is a cross-sectional view taken along line II-II' of FIG. 3A.

FIGS. 3A and 3B, which are views of pixel groups included in an image sensor according to an exemplary embodiment of the inventive concept, illustrate examples of a pixel group included in the pixel array 110 of FIG. 1. FIGS. 4 and 5 are views of pixel groups of an image sensor according to an exemplary embodiment of the inventive concept, wherein FIG. 4 is a cross-sectional view taken along line I-I' of FIG. 3A and FIG. 5 is a cross-sectional view taken along line II-II' of FIG. 3A.

Referring to FIGS. 3A, 4, and 5, a pixel group PG include a semiconductor substrate 100 having a first surface 101 and a second surface 102 opposite to each other, a first pixel region PXR1 and a second pixel region PXR2 formed on the semiconductor substrate 100, and a first isolation layer DTI1 formed to separate the pixel group PG from another pixel group. The pixel group PG may also include a second isolation layer DTI2 for separating the first pixel region PXR1 from the second pixel region PXR2. The first pixel region PXR1 may refer to a region of the semiconductor substrate 100 where at least some components (for example, a photoelectric conversion device and a transfer transistor) of a first pixel (for example, PX1 of FIG. 1) included in the pixel group PG are formed, and the second pixel region PXR2 may refer to a region of the semiconductor substrate 100 where at least some components (for example, a photoelectric conversion device and a transfer transistor) of a second pixel (for example, PX2 of FIG. 1) included in the pixel group PG are formed.

The semiconductor substrate 100 may include at least one selected from, for example, Si, Ge, SiGe, SiC, GaAs, InAs, and InP. According to an embodiment, the semiconductor substrate 100 has a first conductivity type. For example, the first conductivity type may be a p type. A well region may be further formed in the semiconductor substrate 100, and may be doped with impurities of the first conductivity type. In an embodiment, the impurity concentration of the well region is greater than that of a portion of the semiconductor substrate 100 other than the well region.

For example, the first surface 101 of the semiconductor substrate 100 may be a front side surface of the semiconductor substrate 100, and the second surface 102 of the semiconductor substrate 100 may be a back side surface of the semiconductor substrate 100. Circuits may be arranged on the first surface 101, and light may be incident upon the second surface 102.

The first pixel region PXR1 and the second pixel region PXR2 may be aligned with each other in the first direction X. One photoelectric conversion region PCR1 and one photoelectric conversion region PCR2 may be formed in the first pixel region PXR1 and the second pixel region PXR2, respectively. The photoelectric conversion regions PCR1 and PCR2 may be arranged in a matrix configuration in the first direction X and the second direction Y within a pixel array (for example, 110 of FIG. 1) from a planar viewpoint.

In an embodiment, the first photoelectric conversion region PCR1 and the second photoelectric conversion region PCR2 have a second conductivity type different from the first conductivity type. For example, the second conductivity type may be an n type. According to an embodiment, a first photoelectric conversion device (for example, PD1 of FIG. 2) may be formed by a junction between the semiconductor substrate 100 of the first conductivity type and the first photoelectric conversion region PCR1 of the second conductivity type, and a second photoelectric conversion device (for example, PD2 of FIG. 2) may be formed by a junction between the semiconductor substrate 100 of the first conductivity type and the second photoelectric conversion region PCR2 of the second conductivity type. However, embodiments of the inventive concept are not limited thereto. In one example, the first photoelectric conversion device PD1 is formed by a junction between the well region doped with the first conductivity type and the first photoelectric conversion region PCR1 of the second conductivity type. In another example, the second photoelectric conversion device PD2 is formed by a junction between the well region doped with the first conductivity type and the second photoelectric conversion region PCR2 of the second conductivity type.

In an embodiment, the first isolation layer DTI1 and the second isolation layer DTI2 are formed within the semiconductor substrate 100. According to an embodiment, the first isolation layer DTI1 and the second isolation layer DTI2 are formed to vertically extend from the first surface 101 of the semiconductor substrate 100 toward the second surface 102 of the semiconductor substrate 100. In an exemplary embodiment, a first width W1 of one surface of the second isolation layer DTI2 that contacts the first surface 101 is greater than a second width W2 of another surface of the second isolation layer DTI2 that contacts the second surface 102. For example, a first width of one surface of the first isolation layer DTI1 that contacts the first surface 101 may be greater than a second width of another surface of the first isolation layer DTI1 that contacts the second surface 102. However, embodiments of the inventive concept are not limited thereto. According to an exemplary embodiment, the first isolation layer DTI1 and the second isolation layer DTI2 are formed to vertically extend from the second surface 102 of the semiconductor substrate 100 toward the first surface 101 of the semiconductor substrate 100. The shapes of the first isolation layer DTI1 and the second isolation layer DTI2 and a process of manufacturing the first isolation layer DTI1 and the second isolation layer DTI2 may vary.

In an exemplary embodiment, the first isolation layer DTI1 and the second isolation layer DTI2 are formed of an insulating material having a lower refractive index than the semiconductor substrate 100. For example, the first isolation layer DTI1 and the second isolation layer DTI2 may be formed of undoped polysilicon, silicon oxide, silicon nitride, air, or a combination thereof. According to an exemplary embodiment, the first isolation layer DTI1 and the second isolation layer DTI2 are formed to include the same material as each other such as polysilicon.

The first isolation layer DTI1 and the second isolation layer DTI2 may refract incident light beams incident upon the first pixel region PXR1 and the second pixel region PXR2, respectively. The first isolation layer DTI1 and the second isolation layer DTI2 may prevent photocharges generated by the incident light beams from moving to adjacent pixel regions due to a random drift.

In an exemplary embodiment, the first isolation layer DTI1 is formed to surround the first pixel region PXR1 and the second pixel region PXR2, thereby separating a pixel group PG from another pixel group. In other words, one pixel group PG may be defined by the first isolation layer DTI1. The first isolation layer DTI1 may be formed in a lattice shape by extending in the first direction X or the second direction Y.

In an exemplary embodiment, the second isolation layer DTI2 is formed between the first pixel region PXR1 and the second pixel region PXR2 to extend in the second direction Y. However, this is merely an example, and, in contrast with FIG. 3A, the second isolation layer DTI2 may be formed to extend in the first direction X. For example, the first isolation layer DTI1 and the second isolation layer DTI2 may be formed to have a similar shape obtained by rotating the first isolation layer DTI1 and the second isolation layer DTI2 of FIG. 3A by 90 degrees.

In an exemplary embodiment, the second isolation layer DTI2 includes an open region OP that exposes a portion of the area between the first pixel region PXR1 and the second pixel region PXR2. The open region OP may refer to a region where the second isolation layer DTI2 is not formed, and a width OW of the open region O may vary.

Because the second isolation layer DTI2 includes the open region OP, an occurrence of light scattering due to the second isolation layer DTI2 may be reduced, and a light-receiving region within the pixel group PG may be increased. According to an exemplary embodiment, the open region OP is arranged at the center within the pixel group PG. By forming the open region OP of the second isolation layer DTI2 in a center region of the pixel group PG upon which a large amount of light is incident, the light-receiving region may be increased.

According to an exemplary embodiment, the floating diffusion region FD shared by the first pixel PX1 and the second pixel PX2 is formed in the open region OP of the second isolation layer DTI2.

The pixel group PG may include a passivation layer PL. The passivation layer PL may be formed to surround the first isolation layer DTI1 and the second isolation layer DTI2. The passivation layer PL may also be formed to surround the first pixel region PXR1, and may also be formed to surround the second pixel region PXR2. The passivation layer PL may be arranged between the first pixel region PXR1 and the second pixel region PXR2. According to an exemplary embodiment, the passivation layer PL includes silicon doped with the first conductivity type, for example, a p type.

In an embodiment, the passivation layer PL is formed in the open region OP of the second isolation layer DTI2. In the open region OP of the second isolation layer DTI2, in an exemplary embodiment, the passivation layer PL extends from the second surface 102 of the semiconductor substrate 100 in a vertical direction Z perpendicular to the semiconductor substrate 100 by a certain depth PLD. In an embodiment, a depth PLD of the passivation layer PL in the open region OP is less than a depth PLD of the passivation layer PL in a region other than the open region OP. In an embodiment, the floating diffusion region FD included in the pixel group PG is arranged below (for example, in a direction opposite to the Z direction) the passivation layer PL in the open region OP. In an embodiment, the floating diffusion region FD overlaps a portion of the floating diffusion region FD in the X direction and extends beyond the portion to the left and to the right in the X direction.

However, the depth PLD of the passivation layer PL formed in the open region OP of the second isolation layer DTI2 may vary in other embodiments. According to an embodiment, ions of the second conductivity type (n type) opposite to the first conductivity type are injected into the first surface 101 of the semiconductor substrate 100, resulting in a reduction in the depth PLD of the passivation layer PL. Alternatively, according to an embodiment, due to injection of ions with the first conductivity type, the depth PLD of the passivation layer PL may be increased.

The passivation layer PL may provide a potential barrier between the first photoelectric conversion region PCR1 and the second photoelectric conversion region PCR2 by having an opposite conductivity type to the conductivity type of the first photoelectric conversion region PCR1 and the second photoelectric conversion region PCR2. In other words, a potential well between the first photoelectric conversion region PCR1 and the second photoelectric conversion region PCR2 may be formed by the passivation layer PL, and the linearity of the full wells of the first pixel PX1 and the second pixel PX2 may be improved.

The pixel group PG may include the first transfer transistor TX1 and the second transfer transistor TX2 formed to penetrate through the semiconductor substrate 100. The first transfer transistor TX1 and the second transfer transistor TX2 may be vertical transistors. As the first transfer transistor TX1 and the second transfer transistor TX2 are turned on, the photocharges respectively generated by the first photoelectric conversion region PCR1 and the second photoelectric conversion region PCR2 may be accumulated in the floating diffusion region FD.

In an embodiment, a color filter layer CF and a microlens ML are arranged on the second surface 102 of the semiconductor substrate 100. For example, the color filter layer CF or color filter is disposed on the second surface 102 and the microlens is disposed on the color filter. One color filter layer CF and one microlens ML may be arranged on the first pixel region PXR1 and the second pixel region PXR2 included in the single pixel group PG.

The pixel array 110 may include the color filter layer CF so that pixel groups PG may sense various colors. According to an embodiment, the color filter layer CF may be one of filters that respectively sense red (R), green (G), and blue (B), and may be arranged to correspond to a Bayer pattern. However, this is merely an example, and the pixel array 110 may include various types of color filters, for example, filters that respectively sense a yellow color, a cyan color, and a magenta color.

A plurality of interlayer insulation layers, and wiring structures may be further stacked on the first surface 101 of the semiconductor substrate 100. The wiring structures may be a wiring structure for connecting transistors that constitute the first pixel PX1 and the second pixel PX2.

Referring to FIG. 3B, in an exemplary embodiment, a ground contact GND for applying a ground voltage to the first pixel PX1 and the second pixel PX2 is formed in the open region OP of the second isolation layer DTI2. In an embodiment, the ground contact GND is made of a conductive material. For example, in contrast with FIGS. 3A, 4, and 5, a first pixel PX1 and a second pixel PX2 included in a pixel group PG' do not share a floating diffusion region FD and include separate floating diffusion regions, respectively. The ground contact GND for applying a ground voltage to the first pixel PX1 and the second pixel PX2 may be formed in the open region OP of the second isolation layer DTI2.

Alternatively, in contrast with FIGS. 3A and 3B, according to an embodiment, at least one of the transistors shared by the first pixel PX1 and the second pixel PX2, for example, the reset transistor RX of FIG. 2, the amplification transistor SF of FIG. 2, and the selection transistor SX of FIG. 2, may be formed in the open region OP of the second isolation layer DTI2.

As shown in FIGS. 3A and 3B, at least one of the floating diffusion regions included in the pixel group PG', the transistors included in the pixel group PG, and the ground contact GND for applying a ground voltage to the pixel group PG may be arranged below (for example, in the direction opposite to the Z direction) the passivation layer PL in the open region OP.

Figure 6:
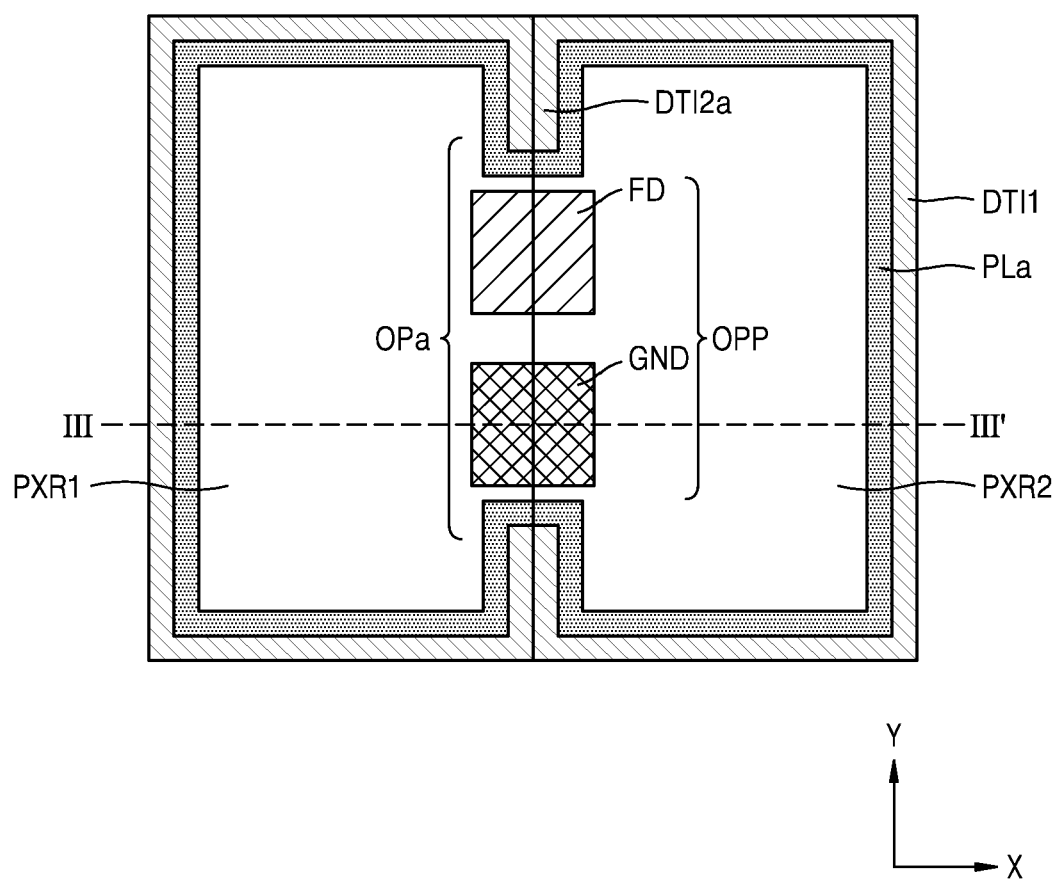
FIG. 6 is a view of a pixel group included in an image sensor according to an exemplary embodiment of the inventive concept.
Figure 7:
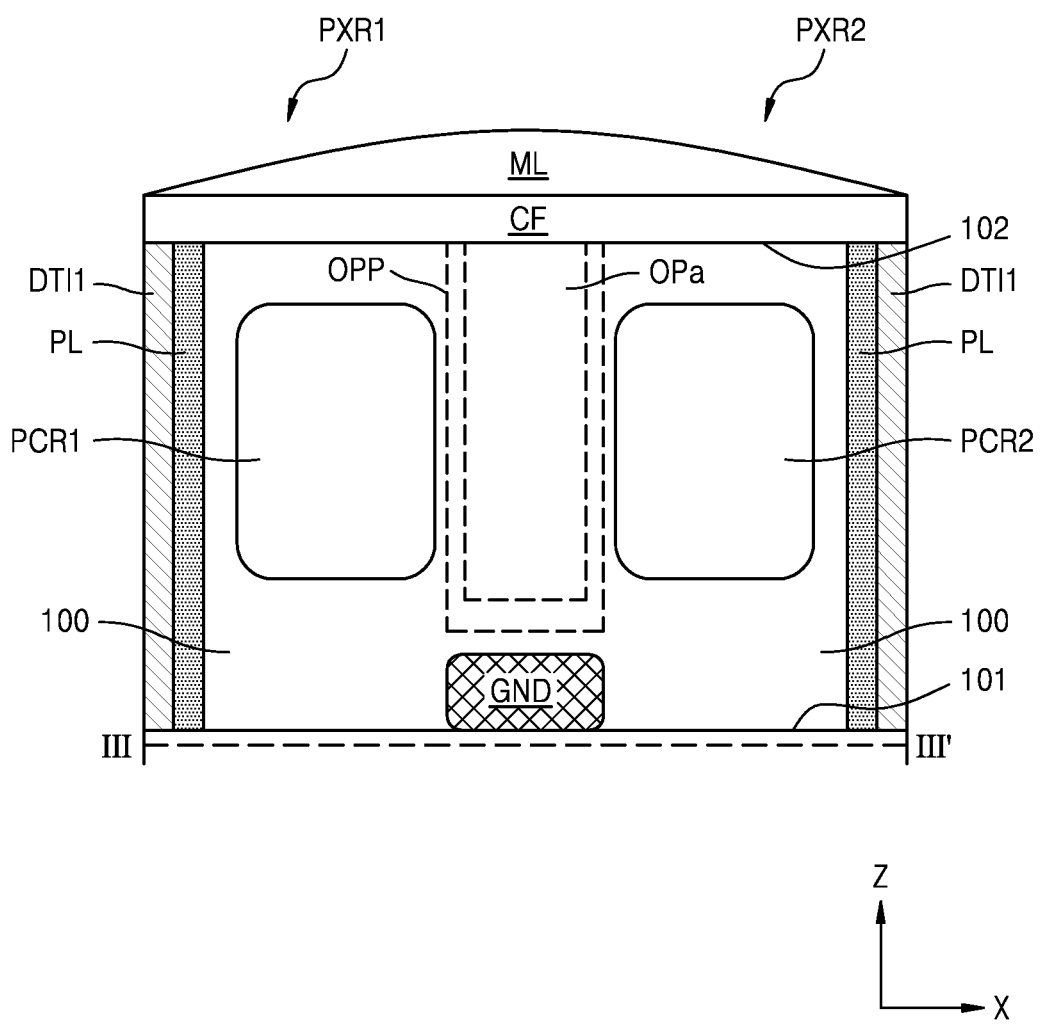
FIG. 7 is a cross-sectional view taken along line of FIG. 6.

FIG. 6, which is a view of a pixel group included in an image sensor according to an exemplary embodiment of the inventive concept, illustrates an example of a pixel group included in the pixel array 110 of FIG. 1. FIG. 7 is a cross-sectional view taken along line of FIG. 6. Descriptions of reference characters in FIGS. 6 and 7 that are the same as those in FIGS. 3A through 5 will be omitted herein.

Referring to FIGS. 6 and 7, a pixel group PGa includes a semiconductor substrate 100, a first pixel region PXR1 and a second pixel region PXR2 formed on the semiconductor substrate 100 and aligned with each other in the first direction X, and a first isolation layer DTI1 formed to separate the pixel group PGa from another pixel group. The pixel group PGa may also include a second isolation layer DTI2a for separating the first pixel region PXR1 from the second pixel region PXR2. The first pixel region PXR1 may refer to a region of the semiconductor substrate 100 where at least some components of a first pixel (for example, PX1 of FIG. 1) included in the pixel group PGa are formed, and the second pixel region PXR2 may refer to a region of the semiconductor substrate 100 where at least some components of a second pixel (for example, PX2 of FIG. 1) included in the pixel group PGa are formed.

In an embodiment, the second isolation layer DTI2a includes an open region OPa that exposes a portion of the area between the first pixel region PXR1 and the second pixel region PXR2. According to an embodiment, at least one of a floating diffusion region FD shared by the first pixel PX1 and the second pixel PX2, transistors shared by the first pixel PX1 and the second pixel PX2, and a ground contact GND for applying a ground voltage to the first pixel PX1 and the second pixel PX2 is formed in the open region OPa of the second isolation layer DTI2a. For example, the floating diffusion region FD and the ground contact GND each shared by the first pixel PX1 and the second pixel PX2 may be formed in the open region OPa.

In an embodiment, a passivation layer PLa is formed to surround the first isolation layer DTI1 and the second isolation layer DTI2. According to an embodiment, the passivation layer PLa includes an open region OPP that exposes a portion of the area between the first pixel region PXR1 and the second pixel region PXR2. The open region OPP may refer to a region where no passivation layer PLas are formed.

In an embodiment, the open region OPP of the passivation layer PLa overlaps with the open region OPa of the second isolation layer DTI2a. In an exemplary embodiment, an area or volume of the open region OPa is smaller than the open region OPP. Accordingly, the first pixel region PXR1 and the second pixel region PXR2 may contact each other in the open region OPP of the passivation layer PLa. However, the passivation layer PLa included in the image sensor according to an embodiment of the inventive concept is not limited to the embodiment of FIG. 6. For example, in an embodiment, the passivation layer PLa does not include the open region OPP as described above with reference to FIG. 5 and is formed to surround the first pixel region PXR1 and is also formed to surround the second pixel region PXR2.

Figure 8:
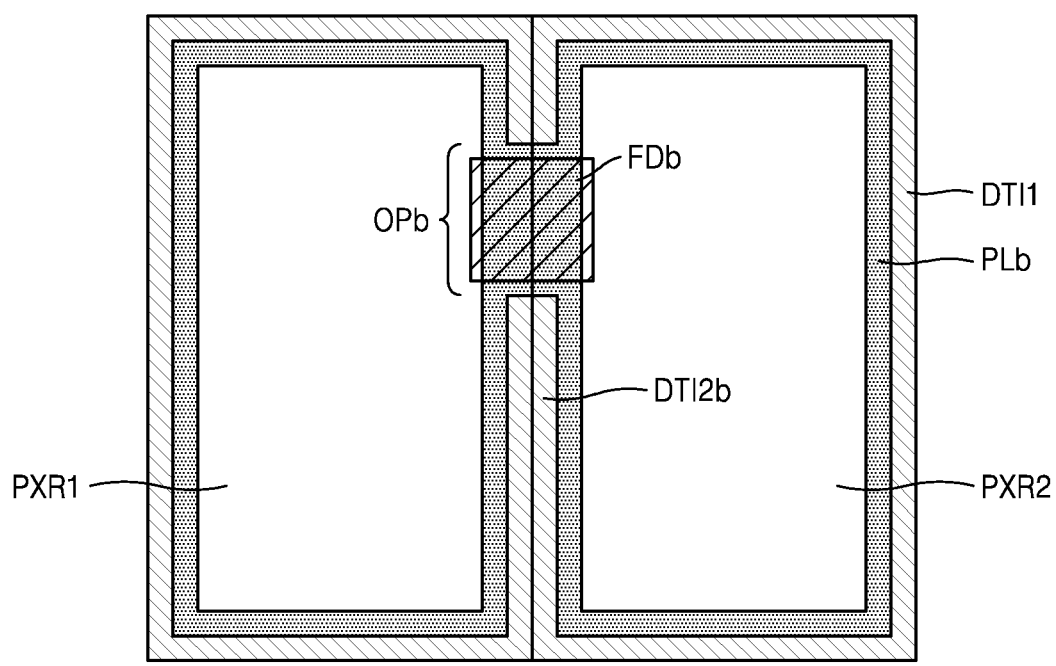
FIG. 8 is a view of a pixel group included in an image sensor according to an exemplary embodiment of the inventive concept.

FIG. 8, which is a view of a pixel group included in an image sensor according to an exemplary embodiment of the inventive concept, illustrates an example of a pixel group included in the pixel array 110 of FIG. 1. Descriptions of reference characters in FIG. 8 that are the same as those in FIGS. 3A through 5 will be omitted herein.

Referring to FIG. 8, a pixel group PGb may include a first pixel region PXR1 and a second pixel region PXR2 aligned with each other in the first direction X, and a first isolation layer DTI1 formed to separate the pixel group PGb from another pixel group. In an embodiment, the pixel group PGb also includes a second isolation layer DTI2b for separating the first pixel region PXR1 from the second pixel region PXR2.

In an embodiment, the second isolation layer DTI2b includes an open region OPb that exposes a portion of the area between the first pixel region PXR1 and the second pixel region PXR2. In an embodiment, the open region OPb is not arranged at the center of the pixel group PGb but is arranged at a location deviating from the center in the second direction Y. The location of the open region OPb shown in FIG. 8 is only for description, and the location of the open region OPb may vary in other embodiments.

According to an exemplary embodiment, a floating diffusion region FDb included in the pixel group PGb is formed in the open region OPb. Alternatively, according to an embodiment, at least one of the transistors included in the pixel group PGb, for example, the reset transistor RX of FIG. 2, the amplification transistor SF of FIG. 2, and the selection transistor SX of FIG. 2, may be formed in the open region OPb. Alternatively, according to an embodiment, a ground contact GND for applying a ground voltage to the pixel group PGb may be formed in the open region OPb.

In an embodiment, the pixel group PGb further includes a passivation layer PLb. In an embodiment, the passivation layer PLb is formed to surround the first isolation layer DTI1 and the second isolation layer DTI2b. The passivation layer PLb may include an open region that partially exposes the first pixel region PXR1 and the second pixel region PXR2, or the passivation layer PLb may be formed to surround the first pixel region PXR1 and surround the second pixel region PXR2 without including an open region.

Figure 9:
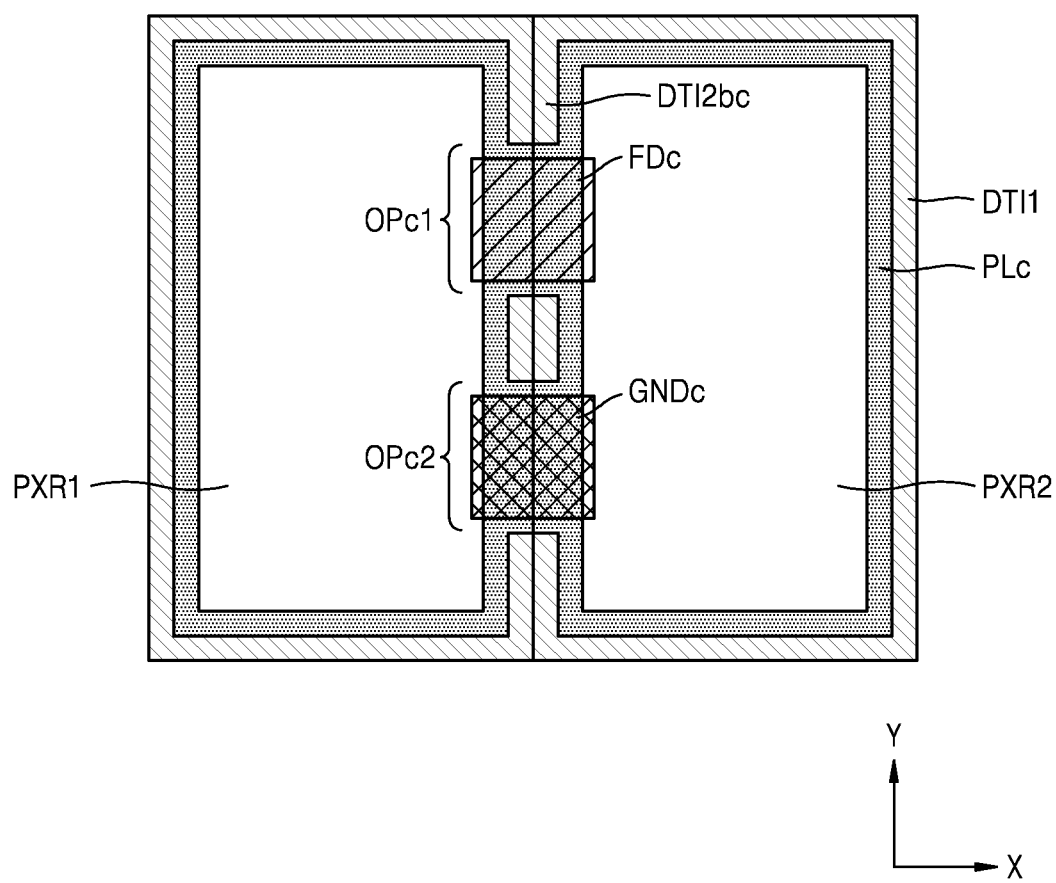
FIG. 9 is a view of a pixel group included in an image sensor according to an exemplary embodiment of the inventive concept.

FIG. 9, which is a view of a pixel group included in an image sensor according to an exemplary embodiment of the inventive concept, illustrates an example of a pixel group included in the pixel array 110 of FIG. 1. Descriptions of reference characters in FIG. 9 that are the same as those in FIGS. 3A through 5 will be omitted herein.

Referring to FIG. 9, a pixel group PGc includes a first pixel region PXR1 and a second pixel region PXR2 aligned with each other in the first direction X, and a first isolation layer DTI1 formed to separate the pixel group PGc from another pixel group. The pixel group PGc may also include a second isolation layer DTI2bc for separating the first pixel region PXR1 from the second pixel region PXR2.

In an exemplary embodiment, the second isolation layer DTI2bc includes a plurality of open regions that expose a portion of the area between the first pixel region PXR1 and the second pixel region PXR2, for example, a first open region OPc1 and a second open region OPc2. The first open region OPc1 and the second open region OPc2 may be aligned with each other in the second direction Y. The first open region OPc1 and the second open region OPc2 may be spaced apart from one another in the section direction Y. Although the second isolation layer DTI2c includes two open regions, namely, the first and second open regions OPc1 and OPc2, in FIG. 2, embodiments of the inventive concept are not limited thereto. The number of open regions formed in the second isolation layer DTI2c may vary.

According to an embodiment, a floating diffusion region FDc included in the pixel group PGb and the transistors included in the pixel group PGb (for example, the reset transistor RX of FIG. 2, the amplification transistor SF of FIG. 2, and the selection transistor SX of FIG. 2), and a ground contact GNDc for applying a ground voltage to the pixel group PGb may be formed in each of the first open region OPc1 and the second open region OPc2. Although the floating diffusion region FDc is formed in the first open region OPc1 and the ground contact GNDc is formed in the second open region OPc2 in FIG. 9, embodiments of the inventive concept are not limited thereto. For example, the floating diffusion region FDc may be formed in the second open region OPc2 and the ground contact GNDc is formed in the first open region OPc1.

In an embodiment, the pixel group PGc further includes a passivation layer PLc. The passivation layer PLc may be formed to surround the first isolation layer DTI1 and the second isolation layer DTI2c. According to an embodiment, the passivation layer PLc includes an open region that partially exposes the first pixel region PXR1 and the second pixel region PXR2. For example, the passivation layer PLc may include at least one open region respectively overlapped by the first open region OPc1 and the second open region OPc2 of the second isolation layer DTI2bc. Alternatively, according to an embodiment, the passivation layer PLc contacts both ends of the first isolation layer DTI1 by continuously extending in the second direction Y, without including open regions.

Figure 10:
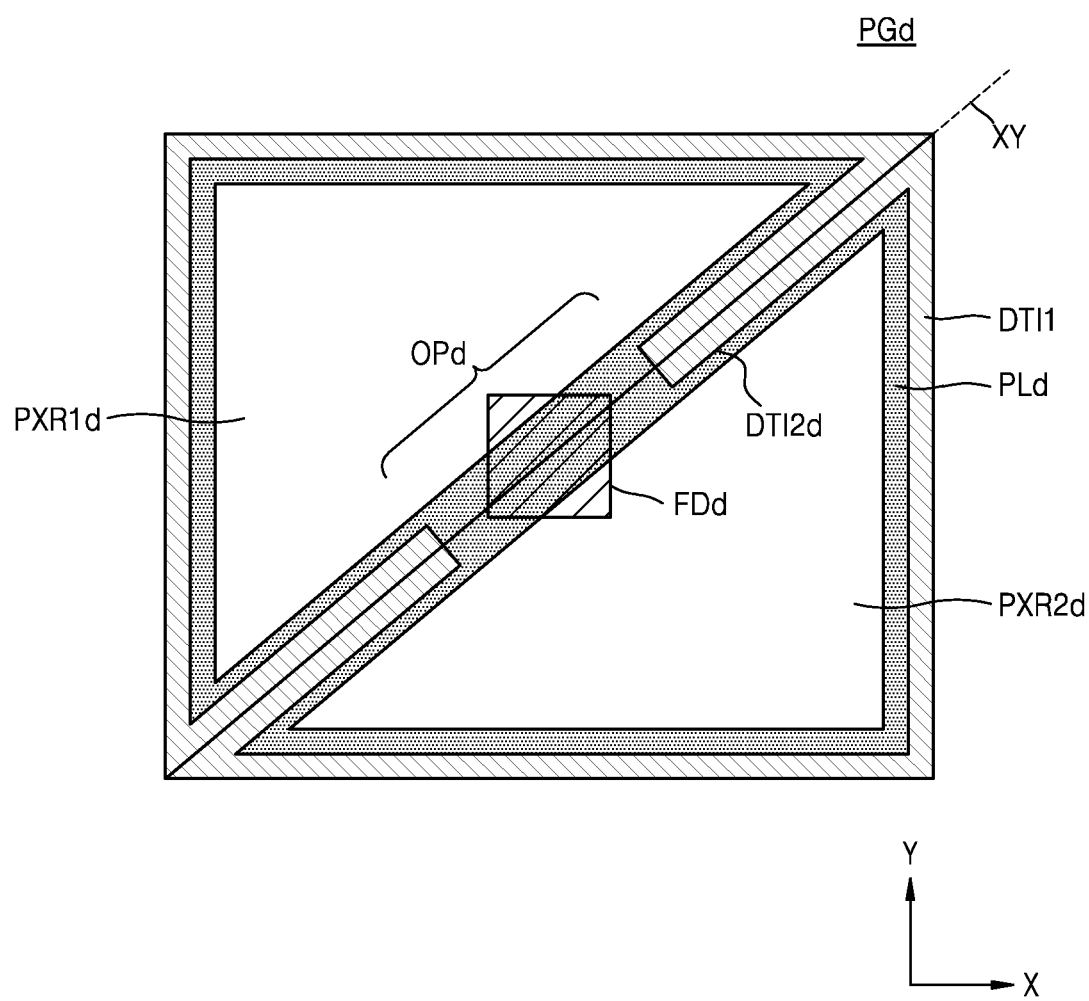
FIG. 10 is a view of a pixel group included in an image sensor according to an exemplary embodiment of the inventive concept.

FIG. 10, which is a view of a pixel group included in an image sensor according to an exemplary embodiment of the inventive concept, illustrates an example of a pixel group included in the pixel array 110 of FIG. 1. Descriptions of reference characters in FIG. 10 that are the same as those in FIGS. 3A through 5 will be omitted herein.

Referring to FIG. 10, a pixel group PGd includes a first pixel region PXR1d and a second pixel region PXR2d separated from each other in a diagonal axis direction XY inclined at a certain angle from the first direction X and the second direction Y. In an exemplary embodiment, the certain angle is an acute angle. According to an embodiment, the first pixel region PXR1d and the second pixel region PXR2d are formed symmetrically in the diagonal axis direction XY. For example, a shape and size of the first pixel region PXR1d may be the same as the second pixel region PXR2d. Based on a first pixel signal and a second pixel signal according to photocharges respectively formed in the first pixel region PXR1d and the second pixel region PXR2d of the pixel group PGd, an AF function in a direction perpendicular to the diagonal axis direction XY may be performed.

In an embodiment, the pixel group PGd includes a first isolation layer DTI1 formed to separate the pixel group PGd from another pixel group. In an embodiment, the first isolation layer DTI1 has a lattice pattern extending in each of the first direction X and the second direction Y, on a plane formed by the first direction X and the second direction Y.

In an embodiment, the pixel group PGd also includes a second isolation layer DTI2d for separating the first pixel region PXR1d from the second pixel region PXR2d. The second isolation layer DTI2d may be arranged between the first pixel region PXR1d and the second pixel region PXR2d and may be formed to extend in the diagonal axis direction XY.

In an embodiment, the second isolation layer DTI2d includes an open region OPd that exposes a portion of the area between the first pixel region PXR1d and the second pixel region PXR2d. According to an embodiment, the open region OPd is arranged at the center within the pixel group PGd. However, embodiments of the inventive concept are not limited thereto, and the open region OPd may be arranged at a location deviating from the center in the diagonal axis direction XY.

According to an embodiment, at least one of a floating diffusion region FDd included in the pixel group PGd, the transistors included in the pixel group PGb, and a ground contact for applying a ground voltage to the pixel group PGb may be formed in the open region OPd.

In an embodiment, the pixel group PGd further includes a passivation layer PLd. The passivation layer PLd may be formed to surround the first isolation layer DTI1 and the second isolation layer DTI2d. The passivation layer PLd may include an open region that partially exposes the first pixel region PXR1d and the second pixel region PXR2d, or the passivation layer PLd may be formed to contact both ends of the first isolation layer DTI1 by continuously extending in the diagonal axis direction XY, without including opening regions.

Figure 11A:
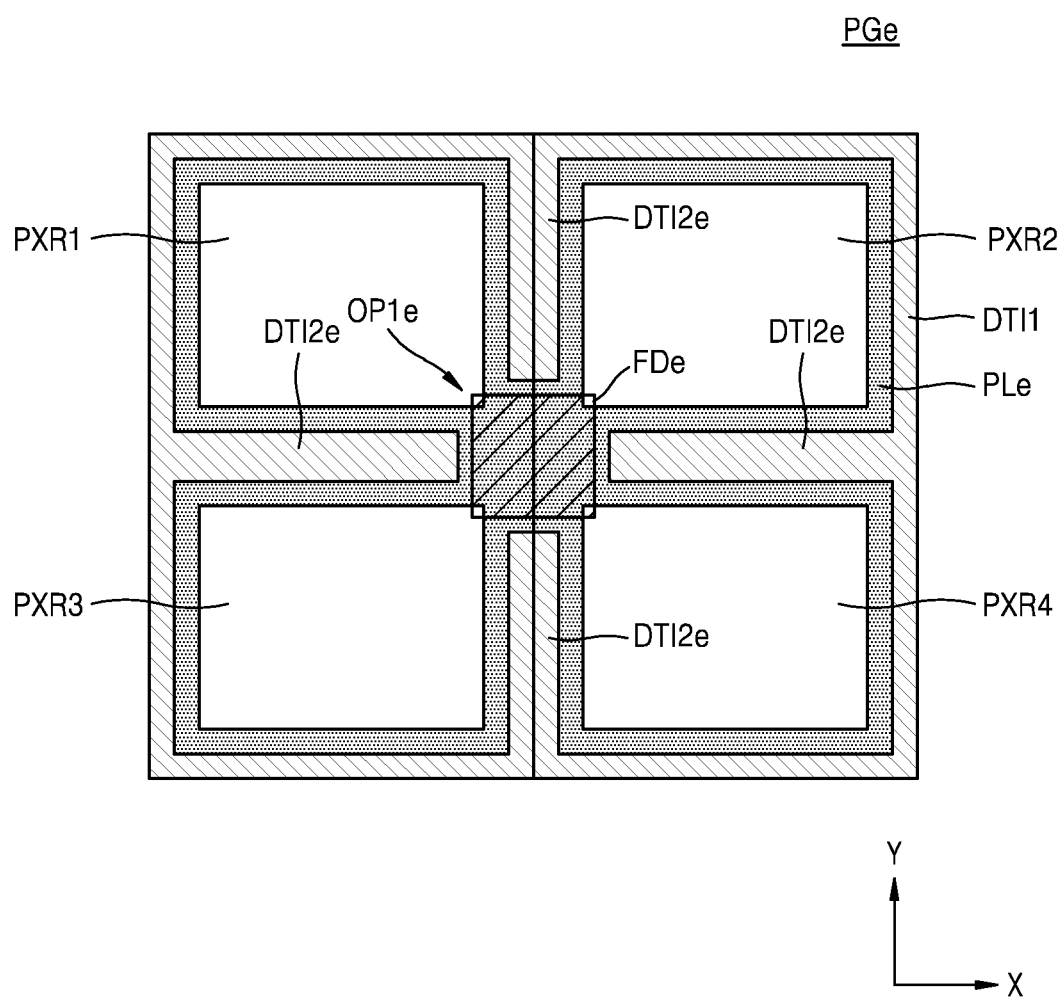
FIGS. 11A and 11B are views of pixel groups included in an image sensor according to an exemplary embodiment of the inventive concept.
Figure 11B:
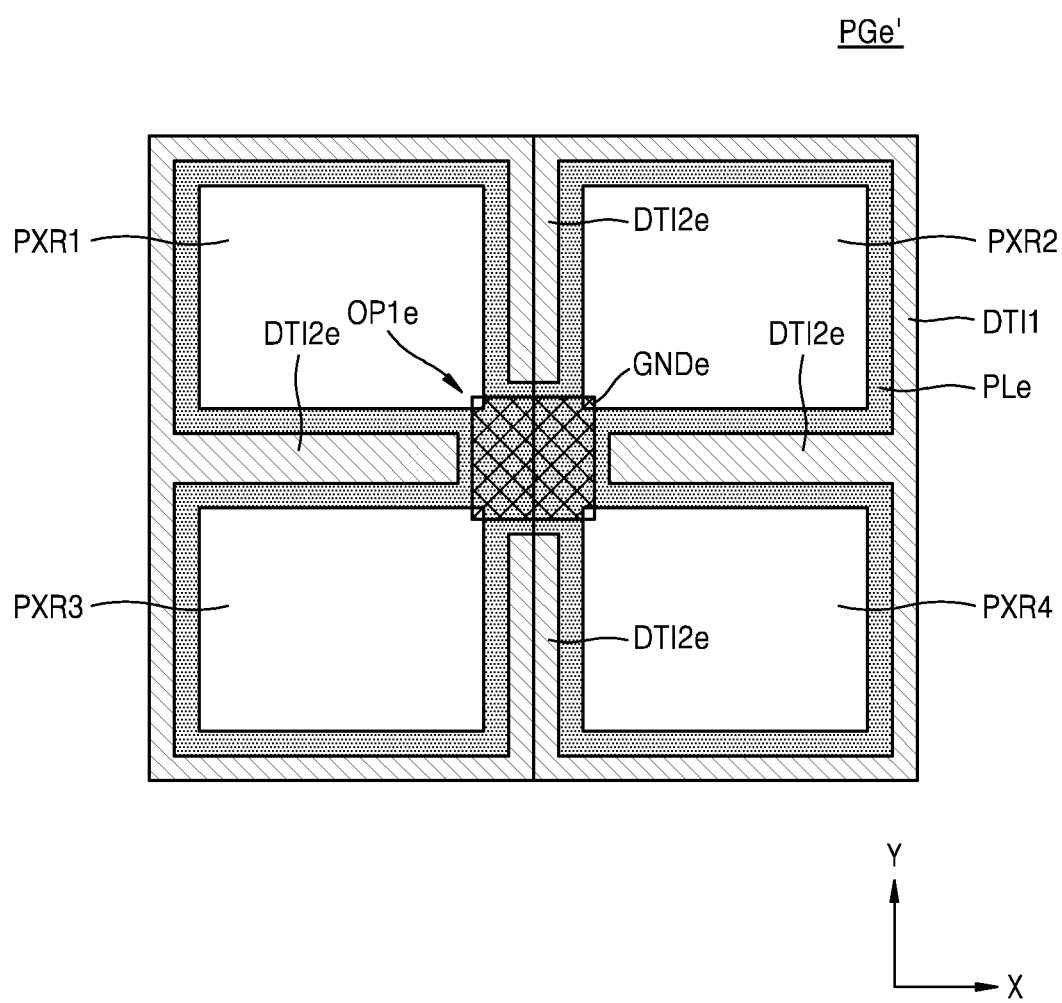

FIGS. 11A and 11B, which are views of pixel groups included in an image sensor according to an exemplary embodiment of the inventive concept, illustrate examples of a pixel group included in the pixel array 110 of FIG. 1. Descriptions of reference characters in FIGS. 11A and 11B that are the same as those in FIGS. 3A through 5 will be omitted herein.

Referring to FIG. 11A, a pixel group PGe includes first through fourth pixel regions PXR1e through PXR4e, and a first isolation layer DTI1 formed to separate the pixel group PGe from another pixel group. In an embodiment, the pixel group PGe also includes a second isolation layer DTI2e for separating the first through fourth pixel regions PXR1e through PXR4e from one another.

Each of the first through fourth pixel regions PXR1e through PXR4e may refer to a region of a semiconductor substrate where at least some components of first through fourth pixels included in the pixel group PGe are formed, for example, a region of the semiconductor substrate where photoelectric conversion devices included in the first through fourth pixels are formed and transfer transistors are formed.

According to an embodiment, the same color filter may be arranged and one microlens may be arranged on the first through fourth pixels included in the pixel group PGe. For example, the color filter CF and microlens ML of FIG. 5 may be arranged on the first through fourth pixels of FIG. 11A. According to an embodiment, the first through fourth pixels included in the pixel group PGe may share at least one of a floating diffusion region FDe, the reset transistor RX of FIG. 2, the amplification transistor SF of FIG. 2, and the selection transistor SX of FIG. 2. However, image sensors according to embodiments of the inventive concept are not limited thereto, and the first through fourth pixels included in the pixel group PGe may include separate floating diffusion regions, separate reset transistors RX, separate amplification transistors SF, and separate selection transistors SX, respectively.

The first pixel region PXR1 and the second pixel region PXR2 may be aligned with each other in the first direction X, and the third pixel region PXR3 and the fourth pixel region PXR4 may be aligned with each other in the first direction X. The first pixel region PXR1 and the third pixel region PXR3 may be aligned with each other in the second direction Y perpendicular to the first direction X, and the second pixel region PXR2 and the fourth pixel region PXR4 may be aligned with each other in the second direction Y. Accordingly, an AF function in the second direction Y may be performed based on pixel signals according to photocharges respectively formed by the first pixel region PXR1 and the second pixel region PXR2, and an AF function in the first direction X may be performed based on pixel signals according to photocharges respectively formed by the first pixel region PXR1 and the third pixel region PXR3.

In an embodiment, the second isolation layer DTI2e is formed between the first pixel region PXR1 and the second pixel region PXR2 to extend in the second direction Y, and is formed between the third pixel region PXR3 and the fourth pixel region PXR4 to extend in the second direction Y. The second isolation layer DTI2e may also be formed between the first pixel region PXR1 and the third pixel region PXR3 to extend in the first direction X, and may be formed between the second pixel region PXR2 and the fourth pixel region PXR4 to extend in the first direction X.

In an embodiment, the second isolation layer DTI2e includes at least one open region OP1e that exposes a portion of the area between the first pixel region PXR1 and the second pixel region PXR2 and exposes a portion of the area between the third pixel region PXR3 and the fourth pixel region PXR4. The second isolation layer DTI2e may also include at least one open region OP1e that exposes a portion of the area between the first pixel region PXR1 and the third pixel region PXR3 and exposes a portion of the area between the second pixel region PXR2 and the fourth pixel region PXR4. According to an embodiment, the at least one open region OP1e is arranged at the center within the pixel group PGe.

According to an embodiment, a floating diffusion region FDe included in the pixel group PGe is formed in the open region OP1e. For example, when the first through fourth pixels included in the pixel group PGe share one floating diffusion region FDe, the floating diffusion region FDe may be arranged in the open region OP1e.

In an embodiment, the pixel group PGe further includes a passivation layer PLe. The passivation layer PLe may be formed to surround the first isolation layer DTI1 and the second isolation layer DTI2e. The passivation layer PLe may include an open region that partially exposes the first through fourth pixel regions PXR1 through PXR4, or the passivation layer PLe may be formed to contact both ends of the first isolation layer DTI1 by continuously extending in the first direction X or the second direction Y, without including opening regions.

Referring to FIG. 11B, in an exemplary embodiment, a ground contact GNDe for applying a ground voltage to a pixel group PGe' is formed in the open region OP1e. A ground voltage may be applied to the first through fourth pixels respectively formed in the first through fourth pixel regions PXR1 through PXR4 through the ground contact GNDe.

Referring to FIGS. 11A and 11B, according to an exemplary embodiment, at least one of the floating diffusion region FDe included in the pixel groups PGe and PGe', the transistors included in the pixel group PGe, and the ground contact GNDe for applying a ground voltage to the pixel group PGe may be formed in the open region OP1e.

Figure 12:
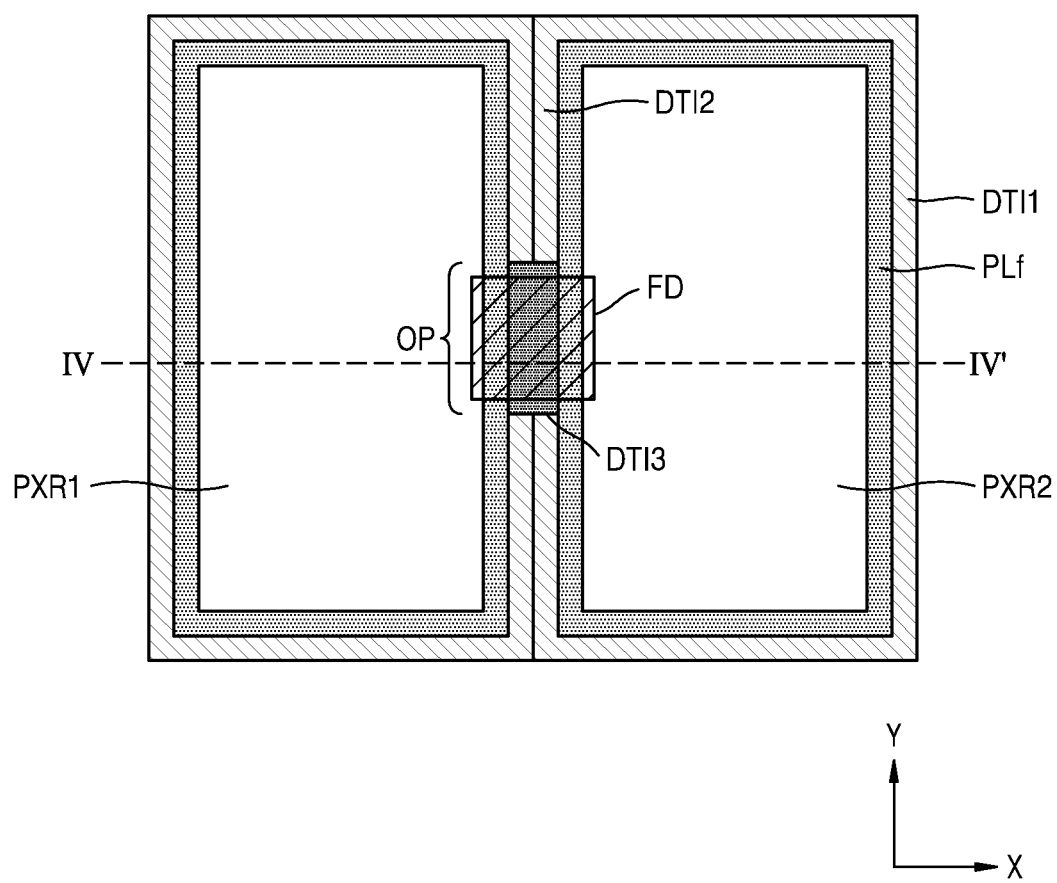
FIG. 12 is a view of a pixel group included in an image sensor according to an exemplary embodiment of the inventive concept.
Figure 13:
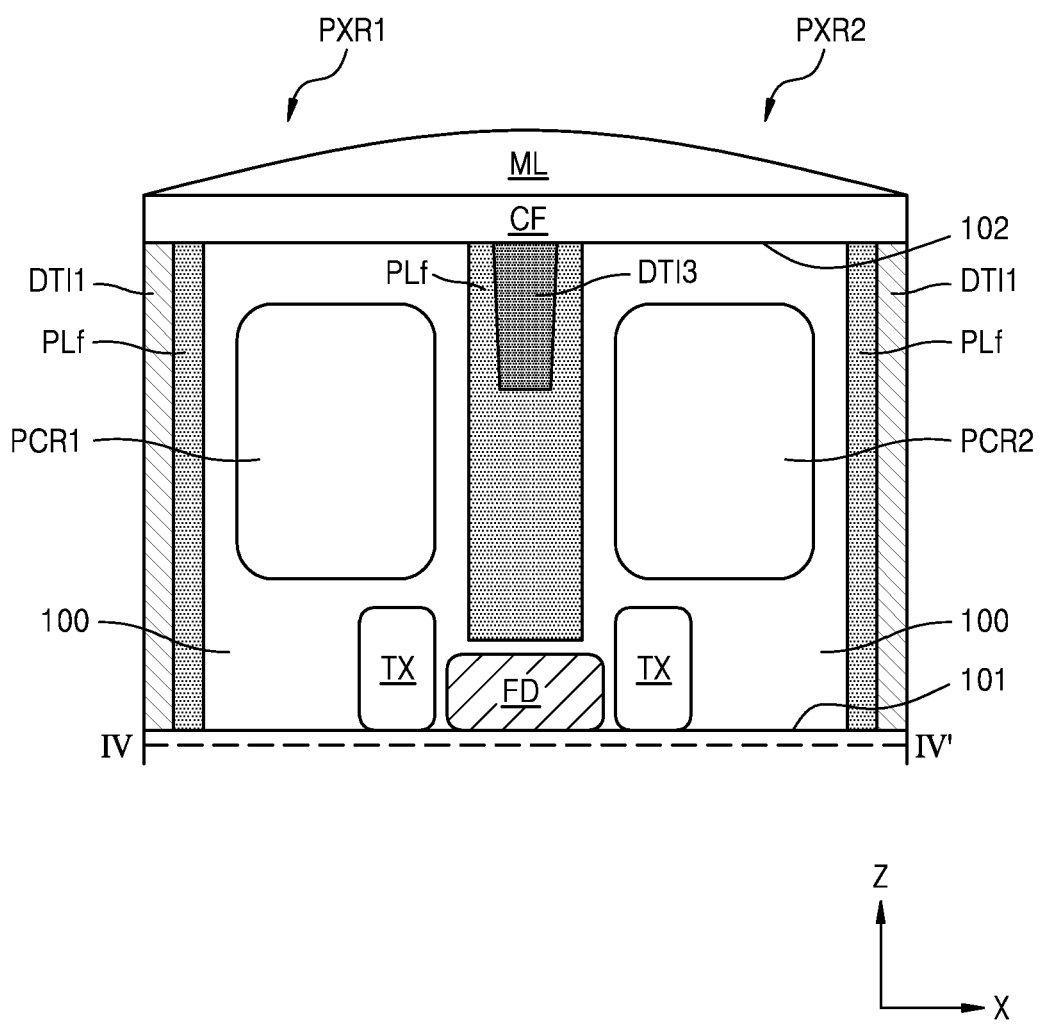
FIG. 13 is a cross-sectional view taken along line IV-IV' of FIG. 12.

FIG. 12, which is a view of a pixel group included in an image sensor according to an exemplary embodiment of the inventive concept, illustrates an example of a pixel group included in the pixel array 110 of FIG. 1. FIG. 13 is a cross-sectional view taken along line IV-IV' of FIG. 12. Descriptions of reference characters in FIGS. 12 and 13 that are the same as those in FIGS. 3A through 5 will be omitted herein.

Referring to FIGS. 12 and 13, in an exemplary embodiment, a pixel group PGf includes a semiconductor substrate 100, a first pixel region PXR1 and a second pixel region PXR2 formed on the semiconductor substrate 100 and aligned with each other in the first direction X, and a first isolation layer DTI1 formed to separate the pixel group PGf from another pixel group. In an embodiment, the pixel group PGf also includes a second isolation layer DTI2 for separating the first pixel region PXR1 from the second pixel region PXR2.

In an embodiment, a third isolation layer DTI3 is formed in the open region OP of the second isolation layer DTI2. According to an embodiment, the third isolation layer DTI3 contacts the second isolation layer DTI2.

The third isolation layer DTI3 may be formed to extend from the second surface 102 of the semiconductor substrate 100 toward the first surface 101 in a vertical direction Z. In an embodiment, the third isolation layer DTI3 is spaced apart from the first surface 101 of the semiconductor substrate 100. According to an embodiment, a width of the third isolation layer DTI3 decreases in a direction away from the second surface 102 of the semiconductor substrate 100. For example, a width of the third isolation layer DTI3 near the second surface 102 may be smaller than a width of the third isolation layer DTI3 near the first surface, and width of the third isolation layer DTI3 may gradually increase as one moves closer to the second surface 102. For example, the third isolation layer DTI3 may include a tapered portion.

In an exemplary embodiment, the third isolation layer DTI3 is formed of an insulating material having a lower refractive index than the semiconductor substrate 100. For example, the first isolation layer DTI1 and the second isolation layer DTI2 may be formed of undoped polysilicon, silicon oxide, silicon nitride, air, or a combination thereof. According to an embodiment, the third isolation layer DTI3 is formed to include the same material as the first isolation layer DTI1 and the second isolation layer DTI2.

According to an embodiment, the first isolation layer DTI1 and the second isolation layer DTI2 contact the first surface 101 and the second surface 102 of the semiconductor substrate 100, whereas the third isolation layer DTI3 does not contact the first surface 101. In an exemplary embodiment, a depth by which the third isolation layer DTI3 extends from the second surface 102 in the vertical direction Z is less than a depth by which each of the first isolation layer DTI1 and the second isolation layer DTI2 extends from the second surface 102. In an embodiment, a passivation layer PLf is arranged below (for example, a direction opposite to the direction Z) the third isolation layer DTI3. Linearity of the full wells of the first pixel PX1 and the second pixel PX2 may be improved by the passivation layer PLf in the open region OP.

In an embodiment, the passivation layer PLf is also formed in the open region OP of the second isolation layer DTI2. In the open region OP of the second isolation layer DTI2, in an embodiment, the passivation layer PLf extends from the second surface 102 of the semiconductor substrate 100 in the vertical direction Z perpendicular to the semiconductor substrate 100 by a certain depth. At least one of a floating diffusion region FD included in the pixel group PGf, the transistors included in the pixel group PGf, and a ground contact for applying a ground voltage to the pixel group PGf may be arranged below the passivation layer PL in the open region OP and the third isolation layer DTI3.

The passivation layer PLf may be formed to surround the first through third isolation layers DTI1 through DTI3. According to an embodiment, the passivation layer PLf includes an open region that partially exposes the first pixel region PXR1 and the second pixel region PXR2. For example, the passivation layer PLf may include an open region overlapped by the open region OP of the second isolation layer DTI2. Alternatively, according to an embodiment, the passivation layer PLf may contact both ends of the first isolation layer DTI1 by continuously extending in the second direction Y, without including open regions.

Figure 14:
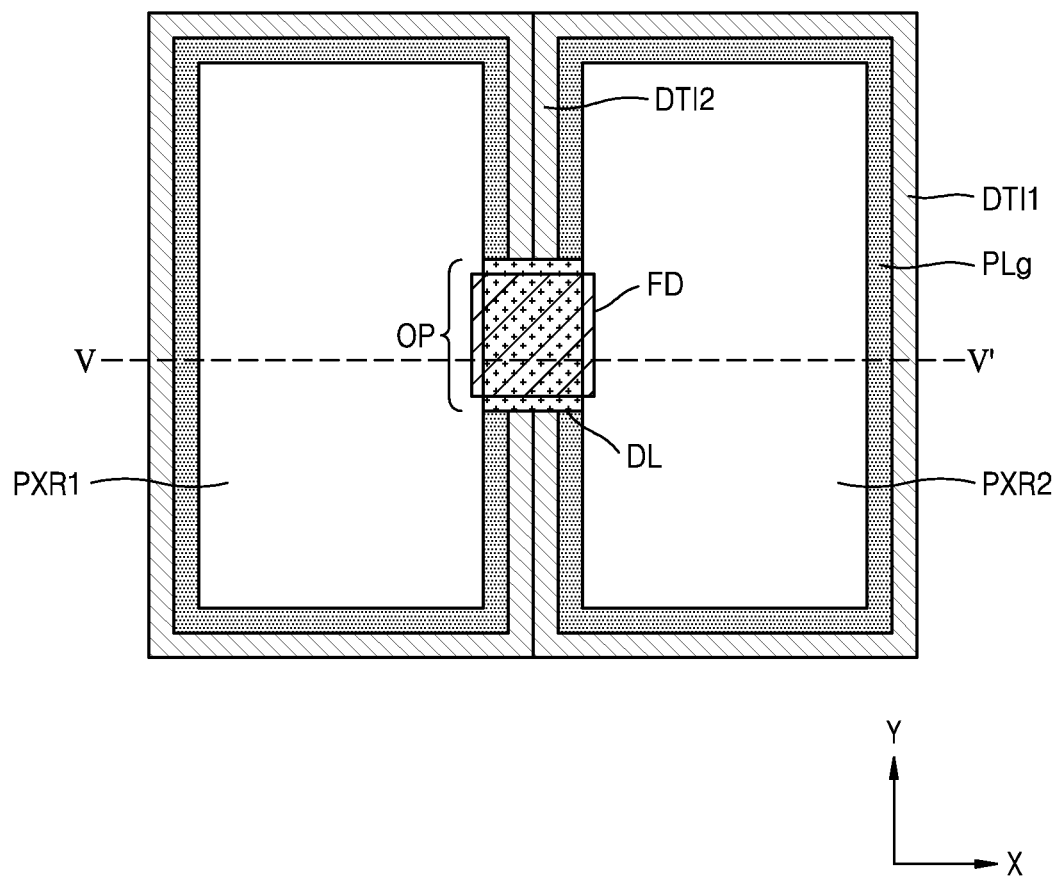
FIG. 14 is a view of a pixel group included in an image sensor according to an exemplary embodiment of the inventive concept.
Figure 15:
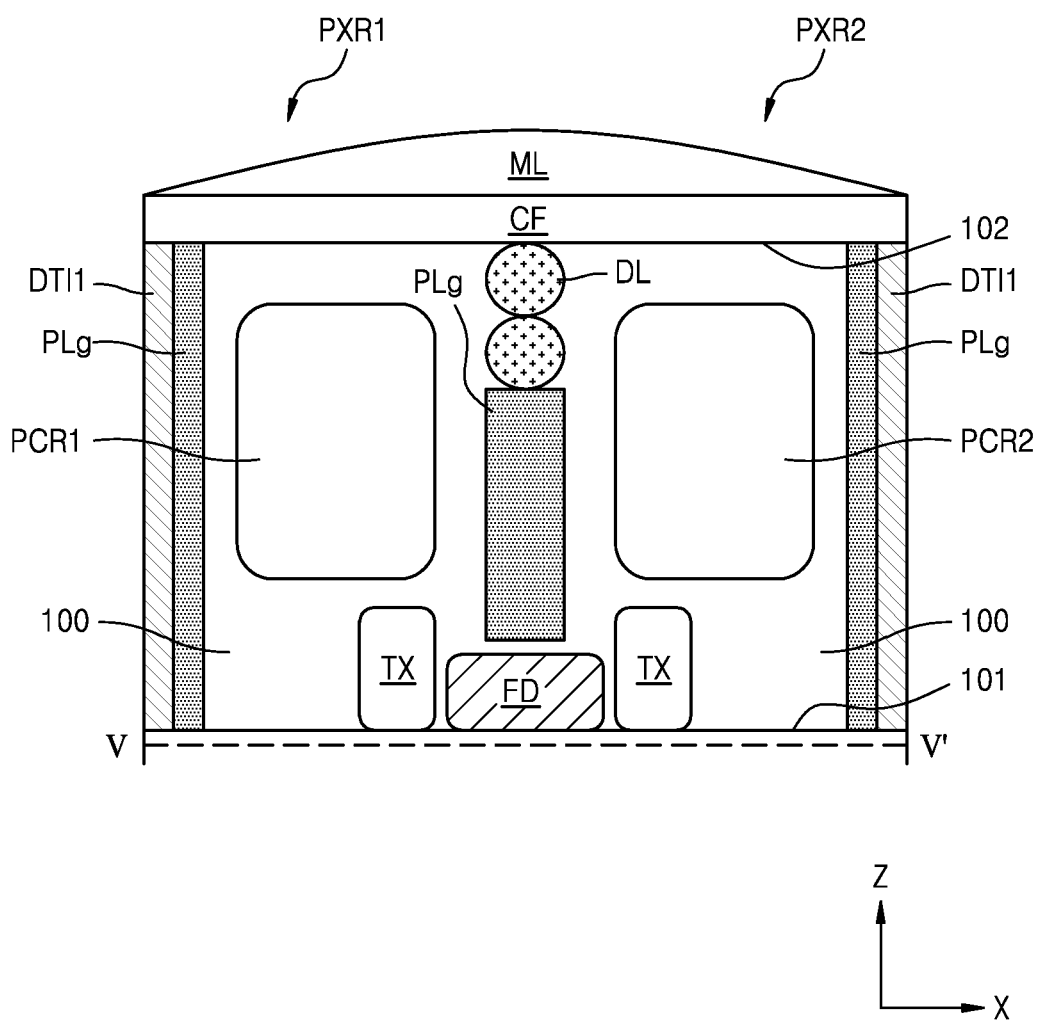
FIG. 15 is a cross-sectional view taken along line V-V' of FIG. 14.

FIG. 14, which is a view of a pixel group included in an image sensor according to an embodiment of the inventive concept, illustrates an example of a pixel group included in the pixel array 110 of FIG. 1. FIG. 15 is a cross-sectional view taken along line V-V' of FIG. 14. Descriptions of reference characters in FIGS. 14 and 15 that are the same as those in FIGS. 3A through 5 will be omitted herein.

Referring to FIGS. 14 and 15, in an exemplary embodiment, a doping region DL is formed in an open region OP of a second isolation layer DTI2 of a pixel group PGg. The doping region DL may form a trench for injecting ions of the first conductivity type, for example, the p type, into the semiconductor substrate 100, and then a passivation layer PLg and a second isolation layer DTI2 may be sequentially formed in the trench. In an embodiment, the doping region DL is arranged closer to the second surface 102 of the semiconductor substrate 100 than to the first surface 101 of the semiconductor substrate 100.

In an embodiment, the doping region DL includes doped silicon. In an embodiment, a doping concentration in the doping region DL is greater than that in the passivation layer PLg.

The passivation layer PLg may be formed to surround the first isolation layer DTI1 and the second isolation layer DTI2. The passivation layer PLg may also be formed in the open region OP of the second isolation layer DTI2, and may be arranged below (for example, a direction opposite to the vertical direction Z) the doping region DL.

Figure 16:
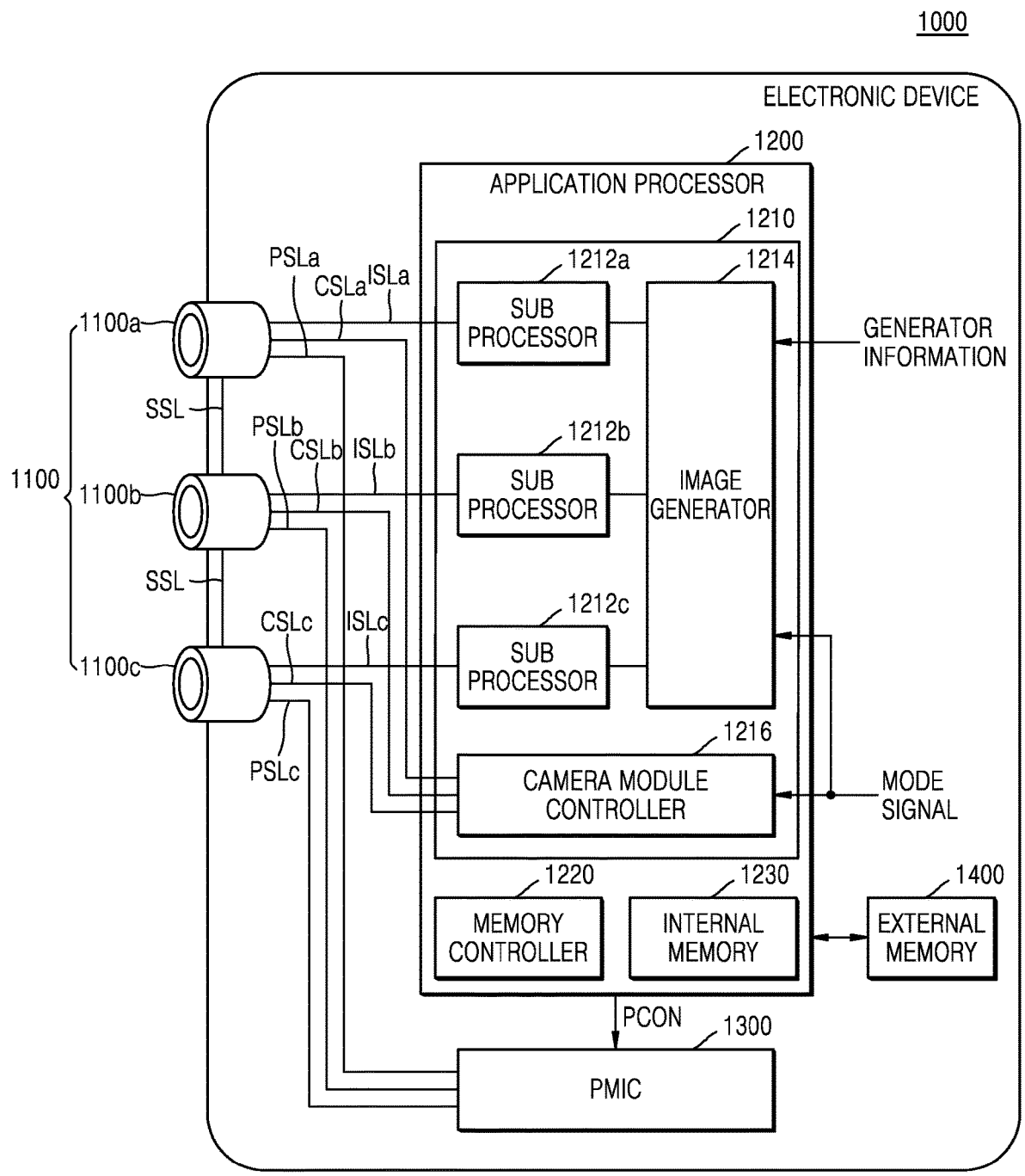
FIG. 16 is a block diagram of an electronic device including a multi-camera module, according to an exemplary embodiment of the inventive concept.
Figure 17:
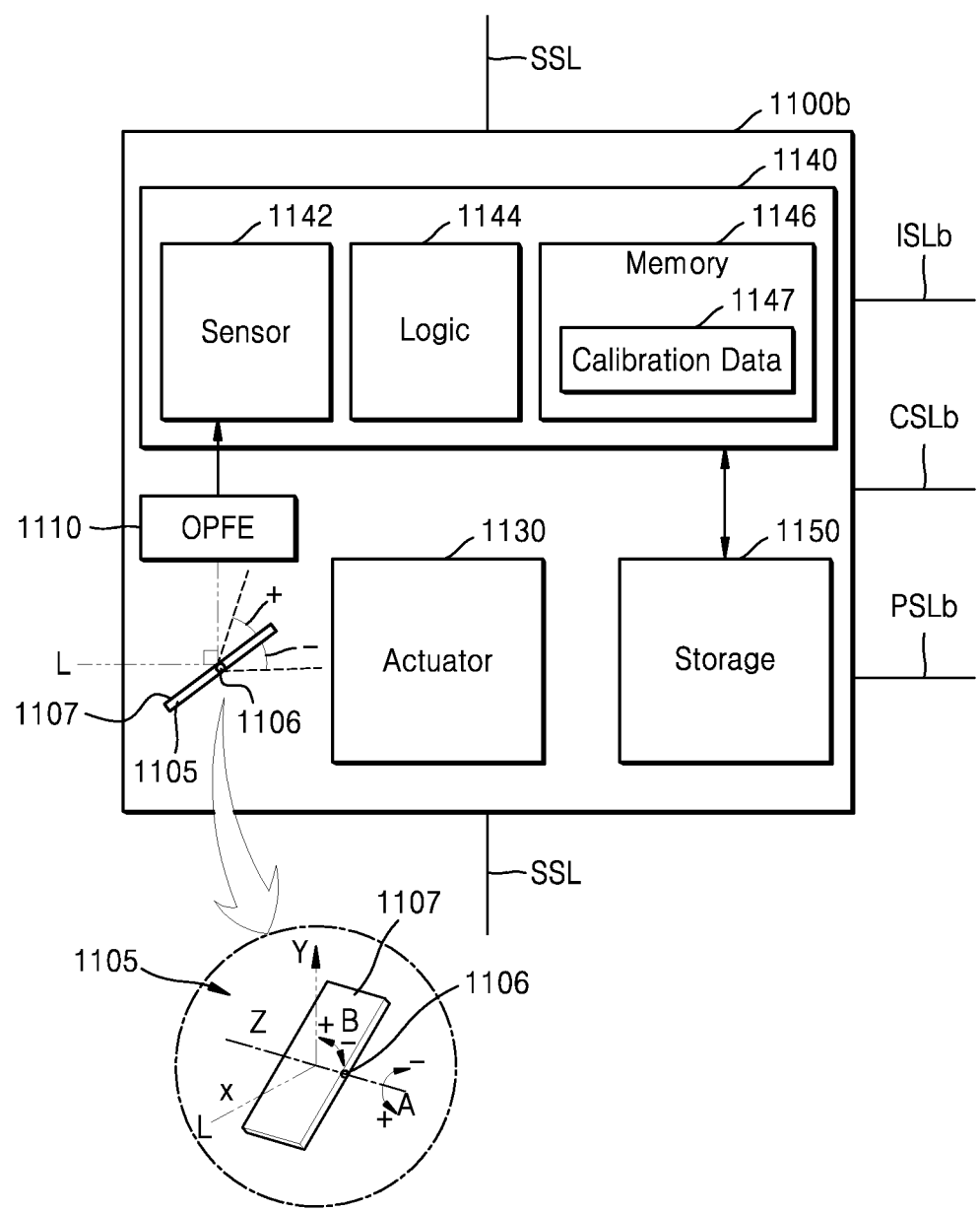
FIG. 17 is a block diagram of a camera module of FIG. 16.

FIG. 16 is a block diagram of an electronic device 1000 including a multi-camera module, according to an exemplary embodiment of the inventive concept. FIG. 17 is a block diagram of a camera module 1100b of FIG. 16. A detailed structure of the camera module 1100b will be described with reference to FIG. 17. However, this description is equally applicable to the other camera modules 1100a and 1100c according to an embodiment.

Referring to FIG. 16, the electronic device 1000 includes a camera module group 1100, an application processor 1200, a power management integrated circuit (PMIC) 1300, and an external memory 1400. The camera module group 1100 may include a plurality of camera modules 1100a, 1100b, and 1100c. Although three camera modules 1100a, 1100b, and 1100c are arranged in FIG. 16, embodiments of the inventive concept are not limited thereto.

Referring to FIGS. 16 and 17, the camera module 1100b may include a prism 1105, an optical path folding element (OPFE) 1110, an actuator 1130, an image sensing device 1140, and a storage 1150 (e.g., a memory device).

The prism 1105 may change a path of light L incident from an external source by including a reflection surface 1107 of a light-reflection material. The OPFE 1110 may include, for example, an optical lens including m (where m is a natural number) groups. The actuator 1130 may move the OPFE 1110 or an optical lens (hereinafter, referred to as an optical lens) to a specific location.

The image sensing device 1140 may include an image sensor 1142, a control logic unit 1144 (e.g., a control circuit), and a memory 1146. The image sensor 1142 may sense an image that is to be captured, by using the light L provided through the optical lens. The image sensor 1142 may be an image sensor including at least one of the pixel groups PG, PGa, PGb, PGc, PGd, PGe, PGf, and PGg described above with reference to FIGS. 1 through 15.

The control logic unit 1144 may control some or all operations of the camera module 1100b. For example, the control logic unit 1144 may control an operation of the camera module 1100b according to a control signal provided via a control signal line CSLb.

According to an embodiment, one camera module (for example, 1100b) from among the plurality of camera modules 1100a, 1100b, and 1100c is a folded lens type camera module including the prism 1105 and the OPFE 1110 each described above, and the other camera modules (for example, 1100a and 1100c) are vertical type camera modules not including the prism 1105 and the OPFE 1110. However, embodiments of the inventive concept are not limited thereto.

According to an embodiment, one camera module (for example, 1100c) from among the plurality of camera modules 1100a, 1100b, and 1100c may be, for example, a vertical-type depth camera that extracts depth information by using infrared (IR) light. In this case, the application processor 1200 may generate a 3D depth image by merging image data received from the depth camera with image data received from another camera module (for example, 1100a or 1100b).

According to an embodiment, at least two camera modules (for example, 1100a and 1100b) from among the plurality of camera modules 1100a, 1100b, and 1100c may have different fields of view. In this case, for example, at least two camera modules (for example, 1100a and 1100b) from among the plurality of camera modules 1100a, 1100b, and 1100c may have different optical lenses, but embodiments of the inventive concept are not limited thereto.

According to an embodiment, the plurality of camera modules 1100a, 1100b, and 1100c have different fields of view from one another. In this case, the plurality of camera modules 1100a, 1100b, and 1100c have different optical lenses, but exemplary embodiments of the inventive concept are not limited thereto.

According to an embodiment, the plurality of camera modules 1100a, 1100b, and 1100c may be arranged by being physically separated from each other. In other words, instead of the sensing region of the image sensor 1142 being divided into the plurality of camera modules 1100a, 1100b, and 1100c and used, the plurality of camera modules 1100a, 1100b, and 1100c may have independent image sensors 1142, respectively.

Referring back to FIG. 16, the application processor 1200 may include an image processing device 1210, a memory controller 1220 (e.g., a control circuit), and an internal memory 1230. The application processor 1200 may be implemented separately from the plurality of camera modules 1100a, 1100b, and 1100c. For example, the application processor 1200 and the plurality of camera modules 1100a, 1100b, and 1100c may be implemented as separate semiconductor chips.

The image processing device 1210 may include a plurality of sub image processors 1212a, 1212b, and 1212c, an image generator 1214, and a camera module controller 1216 (e.g., a control circuit).

The image processing device 1210 may include a plurality of sub image processors 1212a, 1212b, and 1212c, the number of which corresponds to the number of camera modules 1100a, 1100b, and 1100c.

Pieces of image data respectively generated by the camera modules 1100a, 1100b, and 1100c may be provided to the sub image processors 1212a, 1212b, and 1212c, respectively, through image signal lines ISLa, ISLb, and ISLc separated from one another, respectively. For example, the image data generated by the camera module 1100a may be provided to the sub image processor 1212a via the image signal line ISLa, the image data generated by the camera module 1100b may be provided to the sub image processor 1212b via the image signal line ISLb, and the image data generated by the camera module 1100c may be provided to the sub image processor 1212c via the image signal line ISLc. The image data may be transmitted using, for example, a camera serial interface (CSI) based on a mobile industry processor interface (MIPI), but embodiments of the inventive concept are not limited thereto.

The pieces of image data respectively provided to the sub image processors 1212a, 1212b, and 1212c may be provided to the image generator 1214. The image generator 1214 may generate an output image by using the pieces of image data respectively received from the sub image processors 1212a, 1212b, and 1212c according to generator information or a mode signal.

In an embodiment, the image generator 1214 generates an output image by merging at least some of the pieces of image data respectively generated by the camera modules 1100a, 1100b, and 1100c having different fields of view, according to the generating information or the mode signal. The image generator 1214 may generate an output image by selecting at least some from the pieces of image data respectively generated by the camera modules 1100a, 1100b, and 1100c having different fields of view, according to the generating information or the mode signal.

The camera module controller 1216 may provide control signals to the plurality of camera modules 1100a, 1100b, and 1100c, respectively. The control signals respectively generated by the camera module controller 1216 may be provided to the camera modules 1100a, 1100b, and 1100c through the control signal lines CSLa, CSLb, and CSLc separated from one another, respectively.

The application processor 1200 may store a received image signal, namely, an encoded image signal, in the internal memory 1230 inside the application processor 1200 or the external memory 1400 outside the application processor 1200. The application processor 1200 may then read the encoded image signal from the internal memory 1230 or the external memory 1400 and decode the encoded image signal. The application processor 1200 may display image data generated based on the decoded image signal. For example, a sub processor corresponding to the encoded image signal, from among the plurality of sub processors 1212a, 1212b, and 1212c of the image processing device 1210 may perform the decoding and may perform image processing with respect to the decoded image signal.

The PMIC 1300 may provide power, for example, a power voltage, to each of the plurality of camera modules 1100a, 1100b, and 1100c. For example, the PMIC 1300 may provide first power to the camera module 1100a through a power signal line PSLa, may provide second power to the camera module 1100b through a power signal line PSLb, and may provide third power to the camera module 1100c through a power signal line PSLc, under the control of the application processor 1200. For example, the application processor 1000 may output a power control signal PCON to the PMIC 1300 to control the PMIC 1300.

While the inventive concept has been particularly shown and described with reference to exemplary embodiments thereof, it will be understood that various changes in form and details may be made therein without departing from the spirit and scope of the disclosure.

What is claimed is:

1. An image sensor comprising:
    a first pixel region and a second pixel region located within a semiconductor substrate, wherein each of the first pixel region and the second pixel region include a photoelectric conversion device;
    a first isolation layer entirely surrounding the first pixel region and the second pixel region;
    a second isolation layer located between the first pixel region and the second pixel region; and
    a microlens arranged on the first pixel region and the second pixel region,
    wherein the second isolation layer comprises at least one first open region that exposes a portion of an area located between the first pixel region and the second pixel region.

2. The image sensor of claim 1, further comprising a passivation layer surrounding the first isolation layer and the second isolation layer.

3. The image sensor of claim 2, wherein a portion of the passivation layer is located in the at least one first open region.

4. The image sensor of claim 2, wherein the passivation layer comprises a second open region that exposes a portion of an area between the first pixel region and the second pixel region.

5. The image sensor of claim 2, wherein the passivation layer comprises silicon doped with P-type impurities.

6. The image sensor of claim 1, wherein at least one of a floating diffusion region where photocharges are accumulated, a ground contact to which a ground voltage is applied, a reset transistor for resetting the photocharges accumulated in the floating diffusion region, an amplification transistor for amplifying a signal according to the photocharges accumulated in the floating diffusion region, and a selection transistor connected to the amplification transistor to output a pixel signal is located in the first open region.

7. The image sensor of claim 1, wherein the first open region is arranged at a center of a region surrounded by the first isolation layer.

8. The image sensor of claim 1, wherein the second isolation layer comprises a plurality of first open regions that expose a portion of an area between the first pixel region and the second pixel region.

9. The image sensor of claim 1, wherein the first isolation layer has a lattice shape extending in a first direction and a second direction perpendicular to the first direction, and the second isolation layer extends in a direction inclined at a certain angle from the first direction and the second direction.

10. The image sensor of claim 1, further comprising a third pixel region and a fourth pixel region formed within the semiconductor substrate, wherein each of the third pixel region and the fourth pixel region include a photoelectric conversion device, wherein the microlens is arranged on the third pixel region and the fourth pixel region, the first isolation layer surrounds the third pixel region and the fourth pixel region, the second isolation layer is located between the third pixel region and the fourth pixel region, and the first open region exposes a portion of the first through fourth pixel regions.

11. An image sensor comprising:
    a semiconductor substrate having a first surface and a second surface opposite to the first surface;
    a first pixel region and a second pixel region located within the semiconductor substrate, wherein each of the first pixel region and the second pixel region include a photoelectric conversion device;
    a first isolation layer entirely surrounding the first pixel region and the second pixel region; and
    a second isolation layer located between the first pixel region and the second pixel region, wherein the first isolation layer and the second isolation layer extend from the first surface to the second surface of the semiconductor substrate, and the second isolation layer comprises a first open region that exposes a portion of an area located between the first pixel region and the second pixel region.

12. The image sensor of claim 11, further comprising a passivation layer surrounding the first isolation layer and the second isolation layer.

13. The image sensor of claim 12, wherein a portion of the passivation layer is located in the first open region.

14. The image sensor of claim 12, wherein the passivation layer comprises a second open region that exposes a portion of an area between the first pixel region and the second pixel region.

15. The image sensor of claim 11, wherein at least one of a floating diffusion region where photocharges are accumulated, a ground contact to which a ground voltage is applied, a reset transistor for resetting the photocharges accumulated in the floating diffusion region, an amplification transistor for amplifying a signal according to the photocharges accumulated in the floating diffusion region, and a selection transistor connected to the amplification transistor to output a pixel signal is located in the first open region.

16. The image sensor of claim 11, further comprising a third isolation layer located in the first open region, the third isolation layer extending from the second surface and separated from the first surface.

17. The image sensor of claim 11, further comprising a doping region located in the first open region, the doping region doped with P-type impurities, and wherein the doping region is arranged closer to the second surface than to the first surface.

18. An image sensor comprising:
- a first pixel region and a second pixel region located within a semiconductor substrate, wherein each of the first pixel region and the second pixel region includes a photoelectric conversion device;
- a first isolation layer entirely surrounding the first pixel region and the second pixel region;
- a second isolation layer located between the first pixel region and the second pixel region; and
- a floating diffusion region for accumulating photocharges generated by the photoelectric conversion device in each of the first pixel region and the second pixel region,
- wherein the second isolation layer comprises an open region that exposes a portion of an area between the first pixel region and the second pixel region.

19. The image sensor of claim 18, wherein the floating diffusion region is arranged in the open region.

20. The image sensor of claim 18, wherein a ground contact for providing a ground voltage to the first pixel region and the second pixel region is arranged in the open region.

* * * * *